(12) United States Patent
Liu et al.

(10) Patent No.: US 12,205,853 B2
(45) Date of Patent: Jan. 21, 2025

(54) INTEGRATED CIRCUIT TEST METHOD AND STRUCTURE THEREOF

(71) Applicant: Taiwan Semiconductor Manufacturing Co., Ltd., Hsinchu (TW)

(72) Inventors: Hsien-Wen Liu, Hsinchu (TW); Hsien-Wei Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 88 days.

(21) Appl. No.: 17/873,804

(22) Filed: Jul. 26, 2022

(65) Prior Publication Data

US 2022/0367296 A1 Nov. 17, 2022

Related U.S. Application Data

(62) Division of application No. 17/195,537, filed on Mar. 8, 2021, now Pat. No. 11,532,524.

(Continued)

(51) Int. Cl.
*H01L 21/66* (2006.01)
*H01L 23/00* (2006.01)

(52) U.S. Cl.
CPC ............. *H01L 22/14* (2013.01); *H01L 22/20* (2013.01); *H01L 24/03* (2013.01); *H01L 24/05* (2013.01); *H01L 24/08* (2013.01); *H01L 24/13* (2013.01); *H01L 24/32* (2013.01); *H01L 2224/03001* (2013.01); *H01L 2224/0392* (2013.01); *H01L 2224/0401* (2013.01); *H01L 2224/05073* (2013.01); *H01L 2224/05082* (2013.01); *H01L 2224/05083* (2013.01); *H01L 2224/05084* (2013.01); *H01L 2224/05124* (2013.01); *H01L 2224/05147* (2013.01); *H01L 2224/05166* (2013.01); *H01L 2224/05564* (2013.01); *H01L 2224/05573* (2013.01);

(Continued)

(58) Field of Classification Search
CPC ......... H01L 22/14; H01L 22/20; H01L 24/03; H01L 24/05; H01L 2224/0392; H01L 2224/0401; H01L 2224/05073; H01L 2224/05083; H01L 2224/05564; H01L 2224/05573; H01L 2224/05686
See application file for complete search history.

(56) References Cited

U.S. PATENT DOCUMENTS 1,129,666 A 2/1915 Gray
4,937,618 A 6/1990 Ayata et al.
(Continued)

FOREIGN PATENT DOCUMENTS

CN 1725466 A 1/2006
CN 101568844 10/2009
(Continued)

*Primary Examiner* — Douglas W Owens
(74) *Attorney, Agent, or Firm* — Haynes and Boone, LLP

(57) ABSTRACT

A semiconductor device includes a semiconductor die. The semiconductor die includes a device layer, an interconnect layer over the device layer, a conductive pad over the interconnect layer, a conductive seed layer directly on the conductive pad, and a passivation layer encapsulating the conductive pad and the conductive seed layer. The conductive pad is between the interconnect layer and the conductive seed layer.

20 Claims, 21 Drawing Sheets

Related U.S. Application Data

(60) Provisional application No. 63/056,924, filed on Jul. 27, 2020.

(52) U.S. Cl.
CPC .............. *H01L 2224/05647* (2013.01); *H01L 2224/05655* (2013.01); *H01L 2224/05666* (2013.01); *H01L 2224/05686* (2013.01); *H01L 2224/08145* (2013.01); *H01L 2224/13007* (2013.01); *H01L 2224/32145* (2013.01)

(56) References Cited

U.S. PATENT DOCUMENTS

| | | |
|---|---|---|
| 5,059,899 A | 10/1991 | Farnworth |
| 5,212,497 A | 5/1993 | Stanley |
| 5,616,931 A | 4/1997 | Nakamura et al. |
| 5,644,245 A | 7/1997 | Saitoh |
| 7,319,337 B2 | 1/2008 | Sakata |
| 8,361,842 B2 | 1/2013 | Yu et al. |
| 8,497,536 B2 | 7/2013 | Chen et al. |
| 8,541,878 B2 | 9/2013 | Takahashi et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,797,055 B2 | 8/2014 | Tashiro |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 8,900,912 B2 | 12/2014 | Chen et al. |
| 9,000,798 B2 | 4/2015 | Chen |
| 9,711,555 B2 | 7/2017 | Liu et al. |
| 10,161,965 B2 | 12/2018 | Chen et al. |
| 10,453,889 B2 | 10/2019 | Liu et al. |
| 2003/0102878 A1 | 6/2003 | Montoya |
| 2005/0017746 A1 | 1/2005 | Matsumoto |
| 2005/0035447 A1 | 2/2005 | Basho |
| 2006/0028221 A1 | 2/2006 | Hasegawa |
| 2008/0029476 A1 | 2/2008 | Ohmi et al. |
| 2008/0148208 A1 | 6/2008 | Jacobsen |
| 2008/0230902 A1 | 9/2008 | Lin et al. |
| 2008/0314632 A1 | 12/2008 | Wu et al. |
| 2010/0059853 A1 | 3/2010 | Lin et al. |
| 2010/0117672 A1 | 5/2010 | Portune |
| 2010/0157117 A1 | 6/2010 | Wang |
| 2011/0037492 A1 | 2/2011 | Seubert et al. |
| 2011/0233702 A1 | 9/2011 | Takahashi et al. |
| 2011/0291288 A1 | 12/2011 | Wu et al. |
| 2012/0186867 A1 | 7/2012 | Asai |
| 2012/0247823 A1 | 10/2012 | Kasai et al. |
| 2013/0000104 A1 | 1/2013 | Chen |
| 2013/0026468 A1 | 1/2013 | Yoshimuta et al. |
| 2013/0032389 A1 | 2/2013 | Tokura et al. |
| 2013/0036188 A1 | 3/2013 | Chen et al. |
| 2013/0062760 A1 | 3/2013 | Hung et al. |
| 2013/0062761 A1 | 3/2013 | Lin et al. |
| 2013/0075607 A1 | 3/2013 | Bikumandla et al. |
| 2013/0168848 A1 | 7/2013 | Lin et al. |
| 2013/0307140 A1 | 11/2013 | Huang et al. |
| 2014/0042298 A1 | 2/2014 | Wan |
| 2014/0042299 A1 | 2/2014 | Wan |
| 2014/0131858 A1 | 5/2014 | Pan |
| 2014/0138520 A1 | 5/2014 | Liu |
| 2014/0138521 A1 | 5/2014 | Liu |
| 2014/0183748 A1 | 7/2014 | Ooi |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0252647 A1 | 9/2014 | Huang |
| 2014/0264930 A1 | 9/2014 | Yu et al. |
| 2014/0367684 A1 | 12/2014 | Coster |
| 2015/0061149 A1 | 3/2015 | Lin et al. |
| 2015/0091124 A1 | 4/2015 | Liu et al. |
| 2016/0049363 A1 | 2/2016 | Cheng |
| 2016/0316558 A1 | 10/2016 | Sakai |
| 2016/0322305 A1 | 11/2016 | Lee |
| 2017/0040267 A1* | 2/2017 | Yajima .................... H01L 24/05 |
| 2017/0317118 A1 | 11/2017 | Liu et al. |
| 2017/0352626 A1 | 12/2017 | Lin et al. |
| 2018/0240768 A1 | 8/2018 | Paek |
| 2018/0308816 A1 | 10/2018 | Vahela |
| 2019/0164867 A1* | 5/2019 | Hu ...................... H01L 21/76805 |
| 2020/0075470 A1* | 3/2020 | Kuo ................... H01L 23/49866 |
| 2020/0091022 A1 | 3/2020 | Tsai et al. |
| 2020/0135708 A1 | 4/2020 | Chen |
| 2021/0057363 A1 | 2/2021 | Chen |
| 2021/0265306 A1 | 8/2021 | Wu |
| 2022/0084967 A1 | 3/2022 | Su |

FOREIGN PATENT DOCUMENTS

| | | |
|---|---|---|
| CN | 102177585 | 9/2011 |
| CN | 102201418 | 9/2011 |
| CN | 103066081 | 4/2013 |
| CN | 107871718 A | 4/2018 |
| CN | 108389898 A | 8/2018 |
| CN | 111128904 A | 5/2020 |
| CN | 113658932 A | 11/2021 |
| FR | 3089016 A1 | 5/2020 |
| JP | 2010245508 | 1/2010 |
| JP | 2011226817 | 11/2011 |
| KR | 20010057335 | 7/2001 |
| TW | 201533811 A | 9/2015 |
| WO | 2010044826 | 4/2010 |

* cited by examiner

INTEGRATED CIRCUIT TEST METHOD AND STRUCTURE THEREOF

PRIORITY

This is a divisional of U.S. application Ser. No. 17/195,537, filed Mar. 8, 2021, which claims the benefits of and priority to U.S. Provisional Application No. 63/056,924, filed Jul. 27, 2020, herein incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, one area of manufacturing with room for improvement is wafer testing, a mechanism for determining device performance and manufacturing defects. Prior to dicing (the removal of circuit elements such as chips from a semiconductor wafer), test structures as well as functional devices on the wafer are evaluated for electrical performance. Wafer test systems typically utilize a probe card, which includes hundreds to thousands probe tips for making secure electrical connections to test pads on the wafer. Probe tips are either needle tips (or radius tips) or flat tips. Needle tips are more expensive to manufacture and more difficult to maintain than flat tips and have shorter useable life than flat tips. In addition, using needle tips typically leaves marks on test pads after testing, which is undesirable for subsequent processing. Flat tips can be used in large test areas and are more economically feasible than needle tips but can be used only to contact soft materials.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 6A-1, 6A-2, 6A-3, 6A-4, 6B-1, 6B-2, 6B-3, 6B-4, and 6C are cross-sectional views of a portion of a semiconductor device, during various manufacturing stages according to the method in FIG. 5 in accordance with embodiments of the present disclosure.

FIGS. 8A-1, 8A-2, 8B-1, and 8B-2 are cross-sectional views of a portion of a semiconductor device, during a manufacturing stage according to the method in FIG. 7 in accordance with embodiments of the present disclosure.

DETAILED DESCRIPTION

Figure 1:
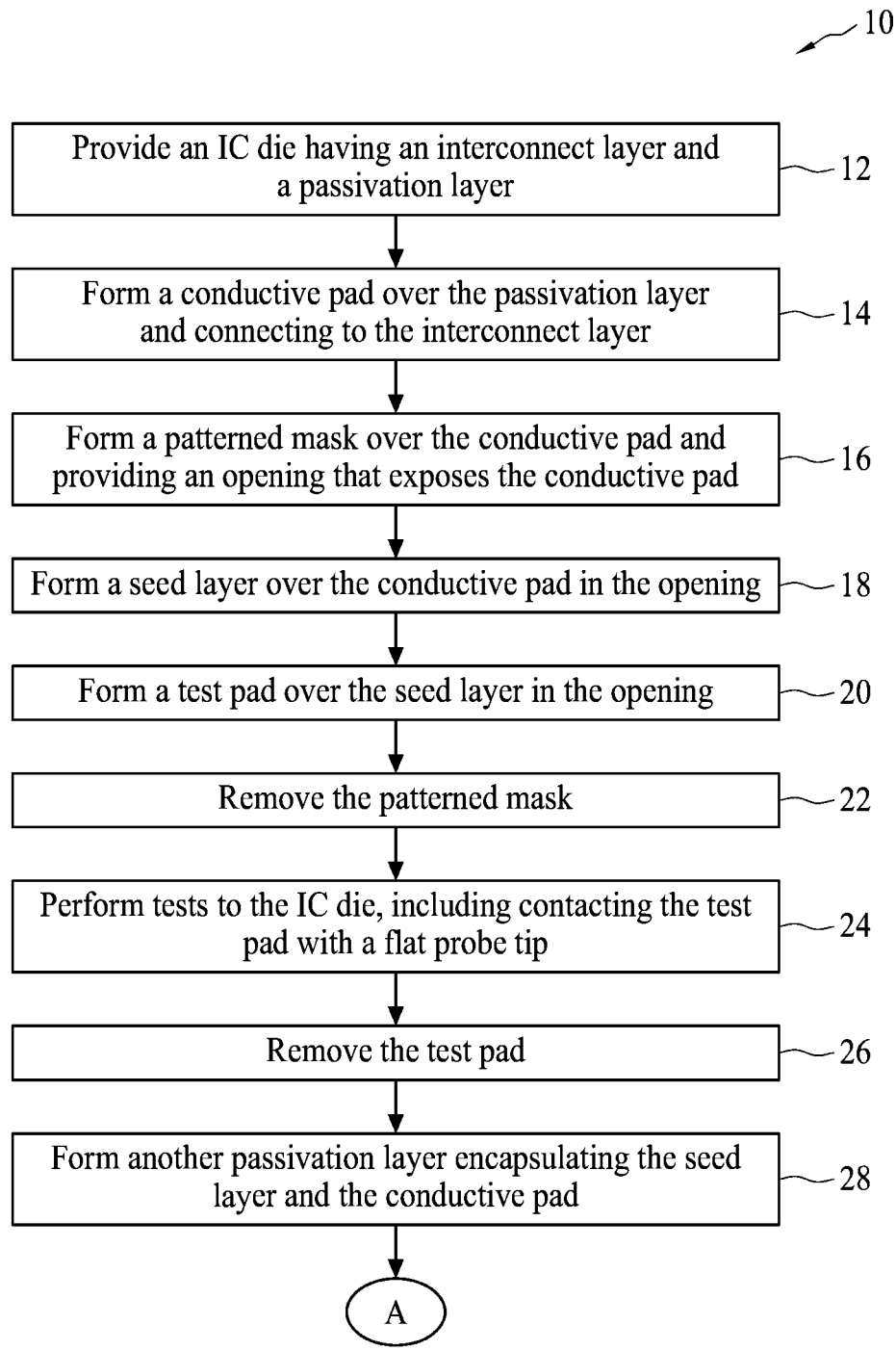
FIG. 1 shows a flow chart of a method of manufacturing wafer and IC according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure is generally related to semiconductor devices and methods of forming the same. More particularly, the present disclosure is related to methods and structures for testing integrated circuit (IC) dies and assembling the known good dies (KGDs) into SoC (System on a Chip) packages or SoIC (System on Integrated Chips) packages.

Before IC dies are assembled into SoC or SoIC packages, the IC dies are tested to make sure they are good (known good dies). Testing of IC dies may be performed using probe tips to electrically contact test pads (such as aluminum (Al) pads) on the IC dies. One type of probe tips is needle tips. Using needle tips require high precision in tip alignment, which reduces test throughput. Also, using needle tips typically leaves marks on the test pads, which is undesirable in certain applications and may require downstream processing to remove the marks. Again, this reduces the manufacturing throughput. Another type of probe tips is flat tips. Flat tips can be used in large test areas and are more economically feasible than needle tips but can be used only to contact soft materials (for example, materials softer than aluminum).

The present disclosure provides methods and structures to solve the above problems by using flat probe tips to perform the tests. In an embodiment of the present disclosure, a seed layer is formed over a test pad (such as an Al pad) of an IC die and a soft metallic material such as tin (Sn) is formed over the seed layer. The IC die is tested by contacting flat probe tips to the soft metallic material. After the testing finishes, the soft metallic material is removed, leaving no probe marks on the seed layer and the test pads. Then, the IC die is processed by downstream processes to form SoC or SoIC. For example, a planarization layer may be formed over the seed layer and the test pad, and bond pads may be formed over the planarization layer. Further, multiple ICs may be bonded using hybrid bond to form SoIC or a part thereof. For another example, micro bumps and solder balls can be formed directly on the seed layer or the test pad to form SoC. The present disclosure provides the following benefits. First, by using flat probe tips, test time can be reduced, throughput can be increased, and testing costs can be reduced. Second, using the disclosed method, the probe testing does not leave marks on the test pads, which simplifies downstream processing. Third, the disclosed methods and structures are compatible with SoC process flows and SoIC process flows. These and other aspects of the present disclosure will be further discussed with reference to FIG. 1 through FIG. 8B-2.

FIG. 1 shows a flow chart of a method 10 of manufacturing (including testing and assembling) a semiconductor structure (also referred to as a structure, a semiconductor device, or a device) 100, according to various aspects of the present disclosure. The structure 100 may include one or more IC dies that are tested and assembled according to embodiments of the present disclosure. The method 10 is merely an example, and is not intended to limit the present disclosure beyond what is explicitly recited in the claims. Additional operations can be provided before, during, and after the method 10, and some operations described can be replaced, eliminated, or moved around for additional embodiments of the method. The method 10 is described below in conjunction with FIGS. 2A-2I.

Figure 2A:
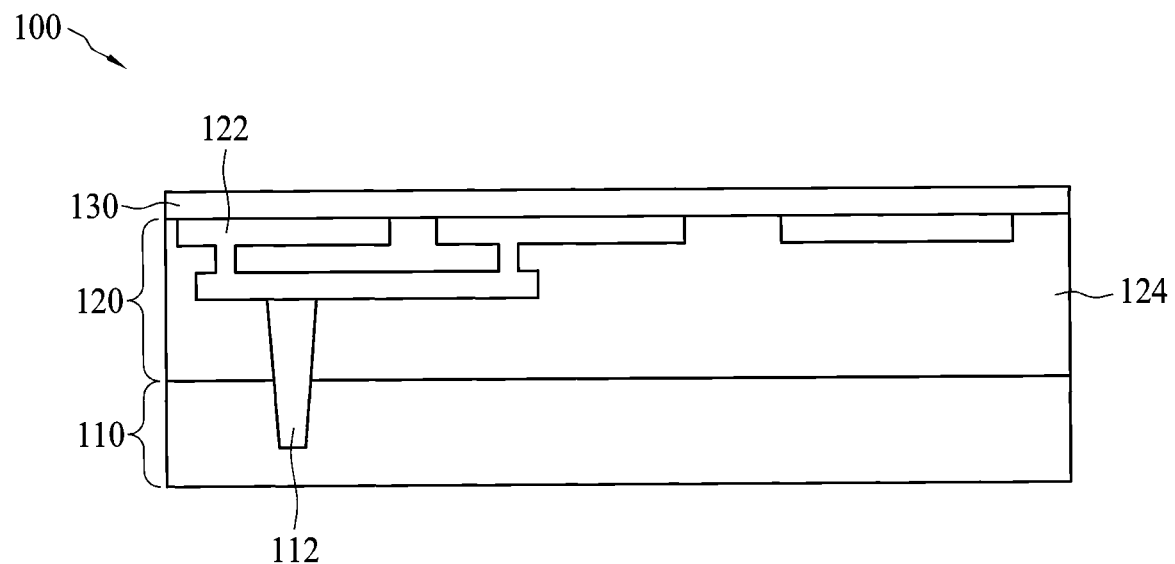
FIGS. 2A, 2B, 2C, 2D, 2E, 2F, 2G, 2H, and 2I are cross-sectional views of a portion of a semiconductor device, during various manufacturing stages according to the method in FIG. 1 in accordance with embodiments of the present disclosure.

At operation 12, the method 10 (FIG. 1) provides or is provided with a structure 100 during an intermediate fabrication stage. In an embodiment, the structure 100 is a semiconductor wafer with one or more IC dies formed thereon. Referring to FIG. 2A, the structure 100 includes a device layer 110, an interconnect layer 120 over the device layer 110, and a passivation layer 130 over the interconnect layer 120. The device layer 110 and the interconnect layer 120 are electrically connected through various conductive features 112 such as contacts, vias, wires, etc.

The device layer 110 includes a substrate that may include an elementary semiconductor such as silicon or germanium and/or a compound semiconductor, such as silicon germanium, silicon carbide, gallium arsenic, indium arsenide, gallium nitride, and indium phosphide. Other example substrates include alloy semiconductors, such as silicon germanium carbide, gallium arsenic phosphide, and gallium indium phosphide. The substrate may have one or more layers defined within it. In some embodiments, the substrate layers include an epitaxial layer. In one such embodiment, the substrate contains an epitaxial layer overlying a bulk semiconductor. Other layered substrates include semiconductor-on-insulator (SOI) substrates. In one such SOI substrate, the substrate includes a buried oxide (BOX) layer formed by a process such as separation by implanted oxygen (SIMOX). The device layer 110 includes various functional devices or features formed in or on the substrate, such as field-effect transistors (FET), metal-oxide-semiconductor (MOS) transistors, bipolar-junction transistor (BJT), imaging sensors, memory devices such as SRAM, and combinations thereof. The functional devices or features may be insulated from each other by isolation features, such as shallow trench isolation (STI) features.

The interconnect layer 120 includes a plurality of patterned dielectric layers 124 and patterned conductive layers 122 combined to form interconnections configured to couple the various functional features in the device layer 110. The dielectric layers 124 may include materials such as tetraethylorthosilicate (TEOS) formed oxide, un-doped silicate glass, or doped silicon oxide such as borophosphosilicate glass (BPSG), fluoride-doped silicate glass (FSG), phosphosilicate glass (PSG), boron doped silicon glass (BSG), and/or other suitable dielectric materials. The dielectric layer 124 may be deposited by a PECVD process, a flowable CVD (FCVD) process, or other suitable deposition technique. The conductive layers 122 may include copper (Cu), aluminum (Al), tungsten (W), cobalt (Co), other metals, metal nitrides such as titanium nitride (TiN), titanium aluminum nitride (TiAlN), tungsten nitride (WN), tantalum nitride (TaN), or combinations thereof, and may be formed by CVD, PVD, plating, and/or other suitable processes.

The passivation layer 130 is formed over the interconnect layer 120 using a suitable process such as a process including a deposition process and a chemical mechanical polishing (CMP) process. In an embodiment, the passivation layer 130 includes a dielectric material, such as silicon oxide ($SiO_2$), silicon nitride ($Si_3N_4$), silicon oxynitride (SiON), or a combination thereof, and may include one layer of a dielectric material or multiple layers of dielectric materials.

Figure 2B:
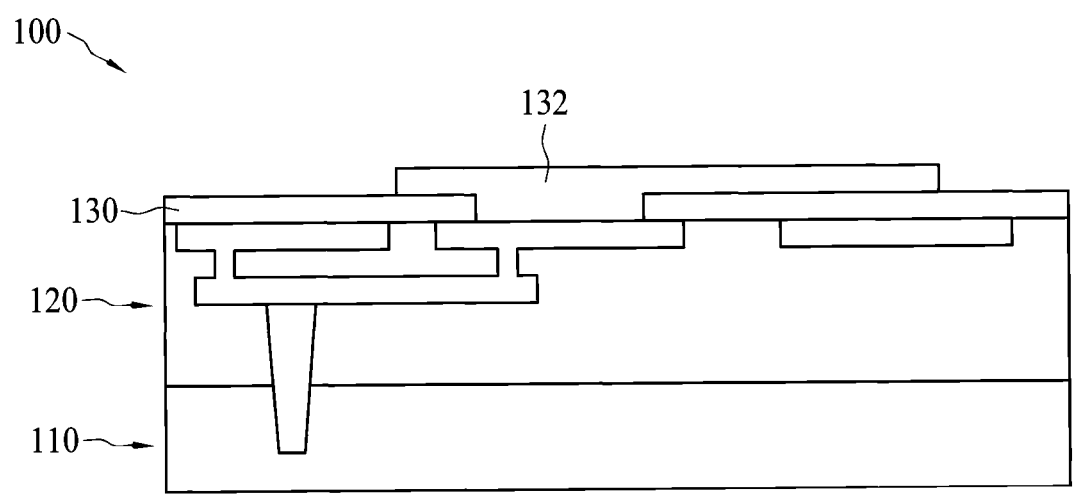

At operation 14, the method 10 (FIG. 1) forms conductive pads 132 over the passivation layer 130, such as shown in FIG. 2B according to an embodiment. The conductive pads 132 penetrate through the passivation layer 130 and electrically connect to the top metal layer 122 in the interconnect layer 120. In an embodiment, the conductive pads 132 include aluminum (Al) and may be referred to as aluminum (Al) pads. In alternative embodiments, the conductive pads 132 may include other conductive materials such as aluminum copper alloy (AlCu), copper (Cu), or titanium (Ti). In an embodiment, operation 14 includes patterning the passivation layer 130 using photolithography and etching processes to create openings therein. The openings expose areas of the top metal layer in the interconnect layer 120. Subsequently, operation 14 includes depositing a layer of one or more conductive materials into the openings and over the top surface of the passivation layer 130. Then, operation 14 includes patterning the layer of one or more conductive martials to remove portions thereof. Remaining portions of the layer of one or more conductive materials become the conductive pads 132. In embodiments, the conductive pads 132 may be deposited using electro plating, electro-less plating, CVD, PVD, or other deposition techniques, and may have a thickness in a range about 2 µm to about 5 µm.

Figure 2C:
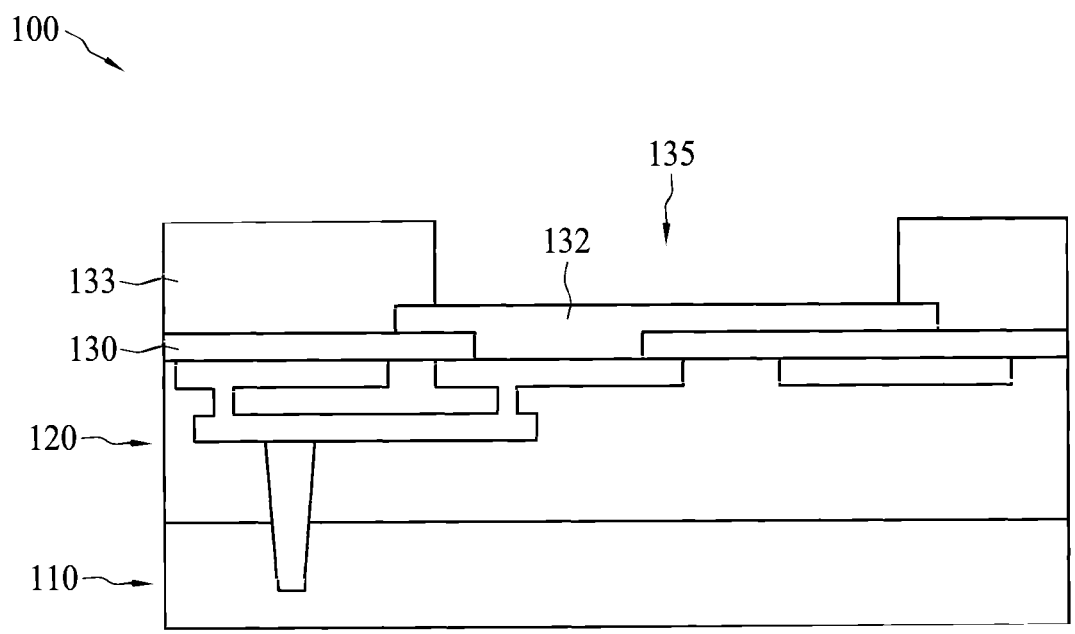

At operation 16, the method 10 (FIG. 1) forms a patterned mask 133 over the passivation layer 130 and the conductive pads 132, such as shown in FIG. 2C according to an embodiment. The patterned mask 133 provides openings 135 directly over the conductive pads 132 and exposing a portion of the conductive pads 132. In an embodiment, one opening 135 is provided above one conductive pad 132. In an embodiment, the patterned mask 133 is formed using processes including deposition, photolithography, and etching. In an embodiment, the patterned mask 133 includes a patterned photoresist (or resist). In another embodiment, the patterned mask 133 includes a patterned resist over a patterned anti-reflective coating (ARC) layer. The patterned mask 133 may include other materials in various embodiments. The material(s) of the patterned mask 133 is selected to provide etch selectivity with respect to the passivation layer 130 and the conductive pads 132. For example, the patterned mask 133 can be etched or removed in an etching process that has no or minimal etching to the passivation layer 130 and the conductive pads 132. As shown in FIG. 2C, some areas of the conductive pads 132 are covered by the patterned mask 133.

Figure 2D:
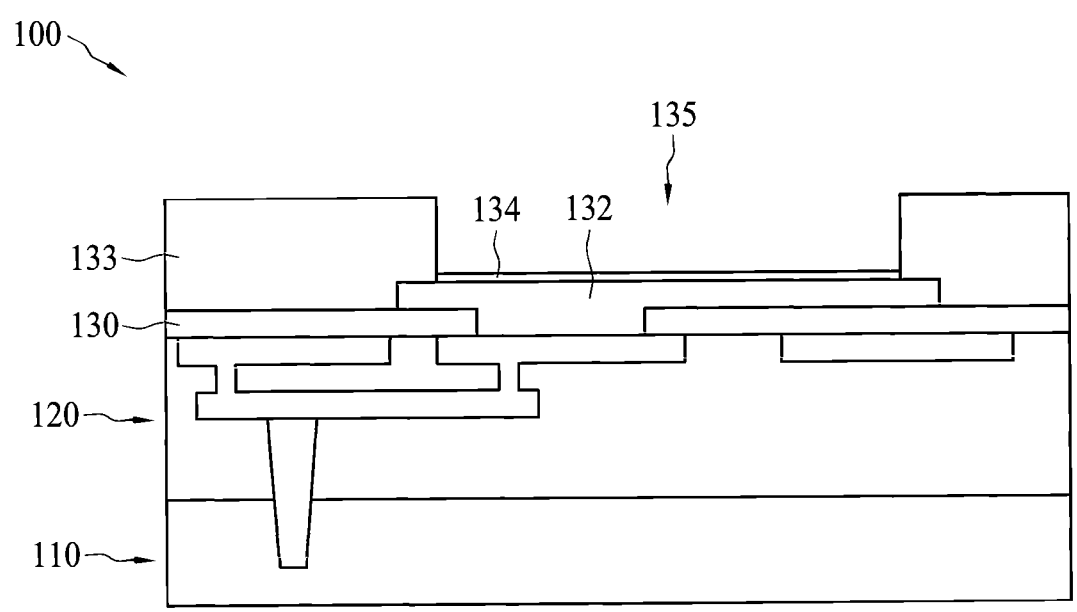
Figure 2E:
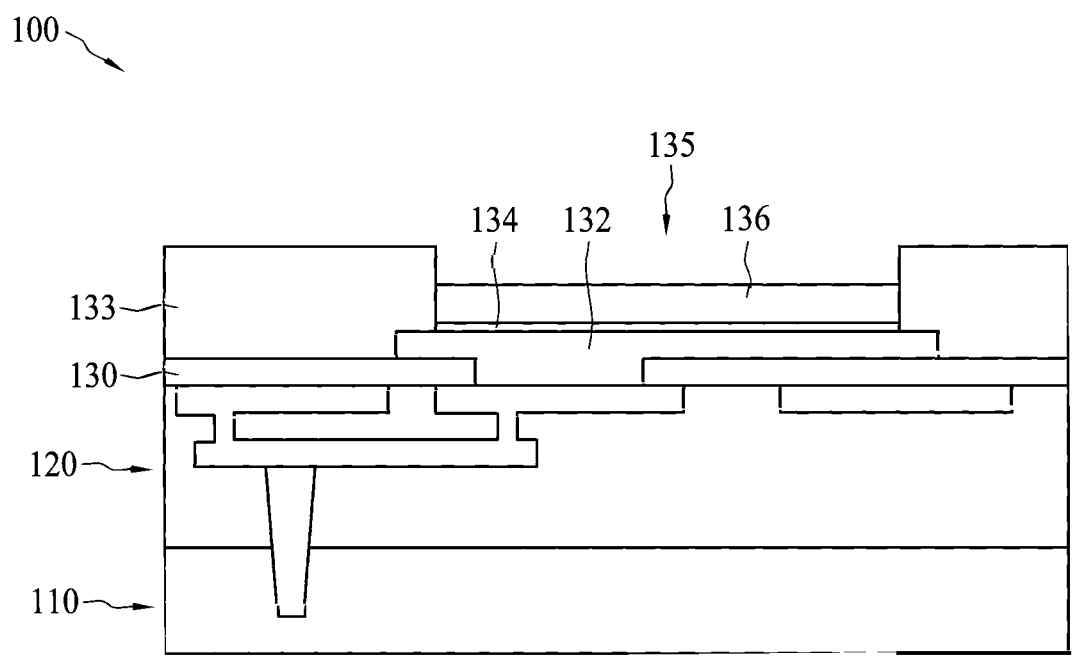

At operation 18, the method 10 (FIG. 1) forms a seed layer 134 in the openings 135 and on the conductive pads 132, such as shown in FIG. 2D. In an embodiment, the seed layer 134 is formed directly on the conductive pads 132. The seed layer 134 functions as an adhesion layer and/or a barrier layer between the conductive pads 132 and subsequently deposited sacrificial test pads 136 (FIG. 2E). Thus, the selection of the material(s) for the seed layer 134 depends on the material(s) of the conductive pads 132 and the sacrificial test pads 136. In an embodiment, the conductive pads 132 includes aluminum, and the seed layer 134 includes titanium copper (TiCu). For example, the seed layer 134 may include a layer of titanium and a layer of copper over the layer of titanium. The layer of titanium may have a thickness in a range about 500 Å to about 1,000 Å and the layer of copper may have a thickness in a range about 3,000 Å to about 5,000 Å in an embodiment. The layer of titanium acts as an adhesion and barrier layer to avoid copper diffusion, while the layer of copper acts as a seed layer for depositing the sacrificial test pads 136. In some embodiments, the seed layer 134 includes a layer of nickel as a stress buffer. The layer of nickel may have a thickness in a range of about 500 nm to about 1,000 nm. In some embodiments, the seed layer 134 includes a layer of titanium nitride. The seed layer 134 may be deposited using ALD, PVD, CVD, or other techniques.

At operation 20, the method 10 (FIG. 1) forms sacrificial test pads 136 over the seed layer 134, such as shown in FIG. 2E. In an embodiment, the sacrificial test pads 136 include a soft material so that they can be contacted by flat probe tips for testing. In an embodiment, the sacrificial test pads 136 include a material softer than aluminum. In an embodiment, the sacrificial test pads 136 include tin (Sn). In alternative embodiments, the sacrificial test pads 136 include lead tin alloy (PbSn). The PbSn alloy may have a high lead to tin ratio (more lead than tin) such as about 95% lead and about 5% tin in an embodiment. The PbSn alloy may have a low lead to tin ratio (less lead than tin) such as about 37% lead and about 63% tin in an embodiment or about 40% lead and about 60% tin in another embodiment. In some embodiments, the sacrificial test pads 136 include a lead-free solder material such as a compound having tin (Sn), silver (Ag), and copper (Cu). In a further embodiment, the compound further includes Zinc (Zn), making a Sn—Ag—Cu—Zn compound. In another further embodiment, the compound further includes manganese (Mn), making it a Sn—Ag—Cu—Mn compound. The sacrificial test pads 136 may include other material(s) in various embodiments. In embodiments, the sacrificial test pads 136 may be deposited using electro plating, electro-less plating, or other deposition techniques, and may have a thickness in a range about 1 µm to about 2 µm.

Figure 2F:
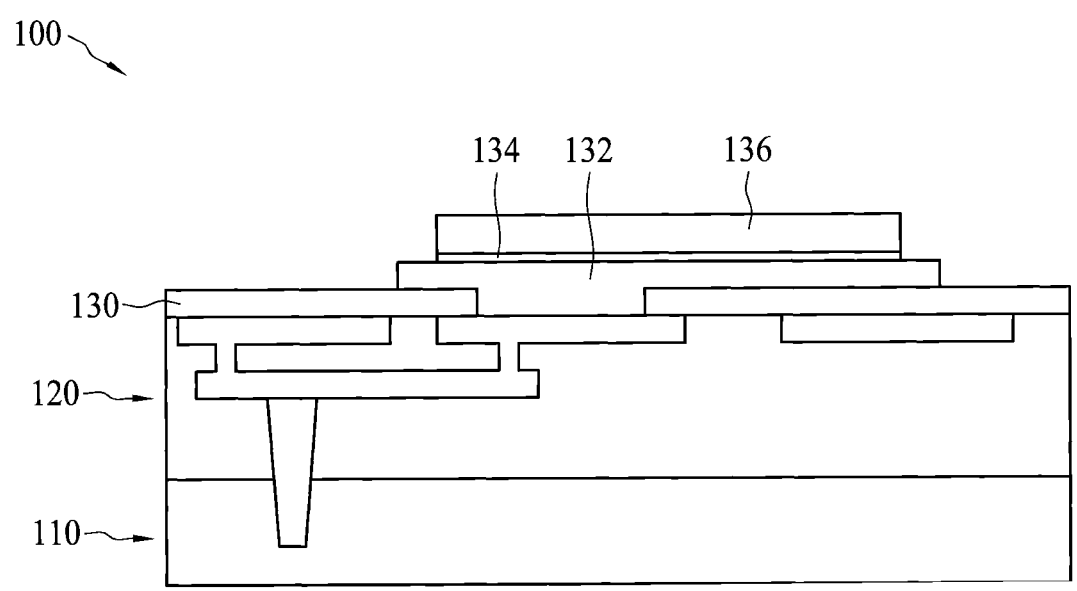

At operation 22, the method 10 (FIG. 1) removes the patterned mask 133 from the structure 100, such as shown in FIG. 2F in an embodiment. In an embodiment, the patterned mask 133 includes a patterned resist and can be removed using resist stripping or other methods. In various embodiments, operation 22 may remove the patterned mask 133 using stripping, ashing, or etching methods that do not etch the passivation layer 130, the conductive pads 132, the seed layer 134, and the sacrificial test pads 136.

Figure 2G:
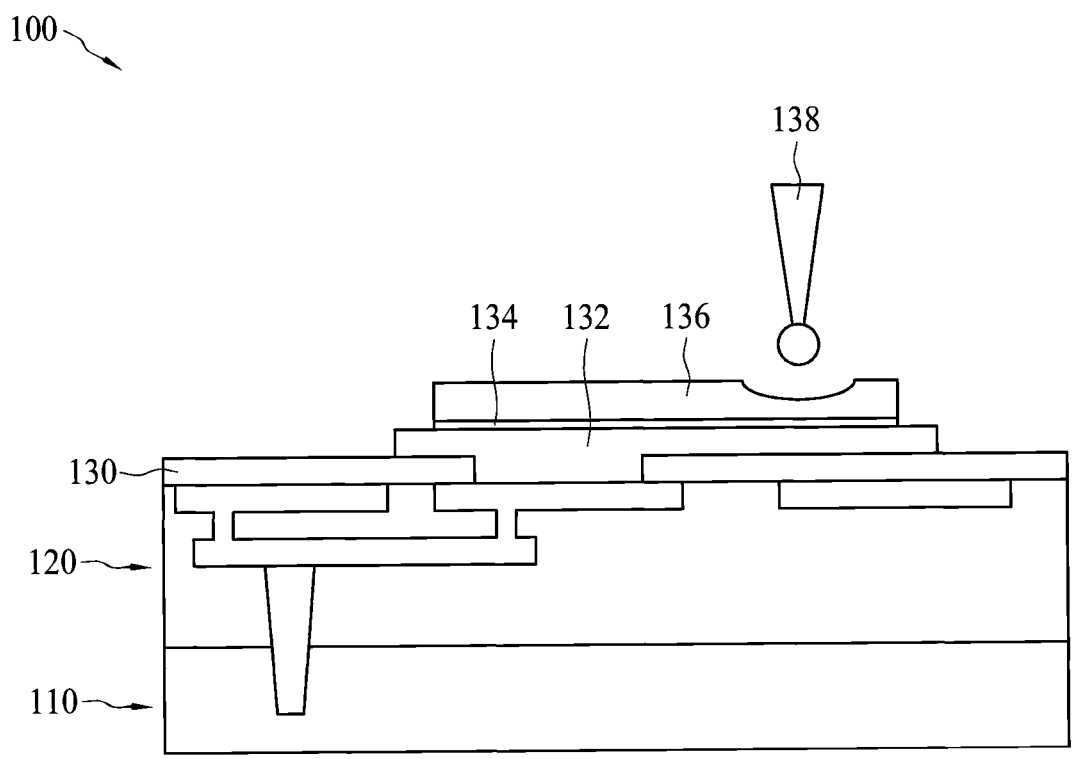

At operation 24, the method 10 (FIG. 1) performs tests to the structure 100 by electrically contacting probe tips 138 to the sacrificial test pads 136, such as shown in FIG. 2G. Operation 24 may include aligning the probe tips 138 with the sacrificial test pads 136, electrically contacting the sacrificial test pads 136 with the probe tips 138, applying test stimulus to the structure 100 that include IC dies, collecting responses from the structure 100, and analyzing the responses. The various IC dies in the structure 100 may be identified as good dies (passing the tests) or bad dies (failing the tests). In an embodiment, the identified good dies are passed to downstream processing such as being packaged as individual chips or being bonded with other known good dies to form SoC or SoIC. In an embodiment, the probe tips 138 are flat tips. Flat probe tips are more economically to make and maintain than needle tips, thus can reduce manufacturing costs. The sacrificial test pads 136 are designed with a soft material, allowing the flat probe tips 138 to make secure electrical connection therewith. The probe tips 138 can be needle tips in an alternative embodiment. The probe tips 138 can have any suitable shapes in various embodiments. In some embodiments, contacting the probe tips 138 to the sacrificial test pads 136 may leave marks on the sacrificial test pads 136.

Figure 2H:
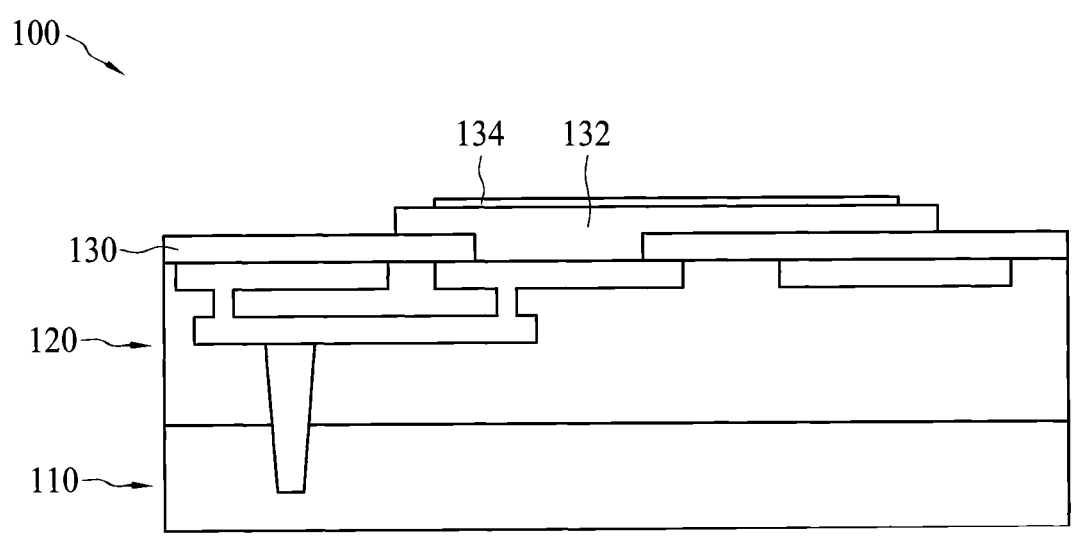

At operation 26, the method 10 (FIG. 1) removes the sacrificial test pads 136 from the structure 100, for example, after the testing has finished. The sacrificial test pads 136 can be removed by a suitable etching process, such as a wet etching or a dry etching that is selective to the material(s) of the sacrificial test pads 136 and with little or no etching to the passivation layer 130, the seed layer 134, and the conductive pads 132. The marks on the sacrificial test pads 136 caused by the testing (operation 24) are removed as well. The resultant structure 100 is shown in FIG. 2H in an embodiment.

Figure 2I:
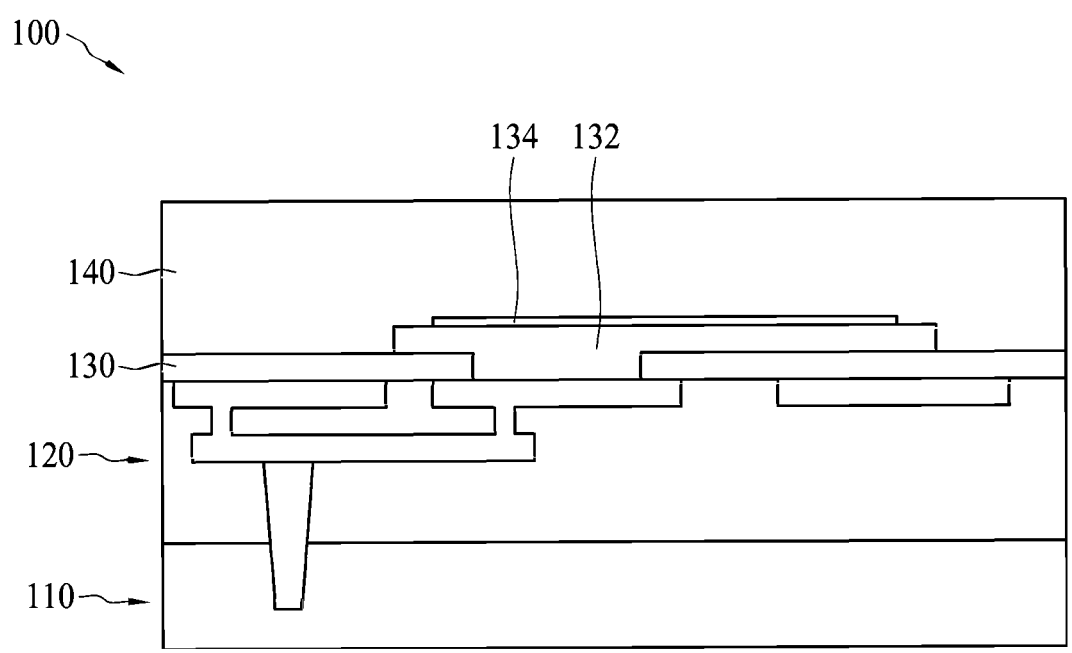

At operation 28, the method 10 (FIG. 1) forms a passivation layer 140 encapsulating the seed layer 134 and the conductive pads 132, such as shown in FIG. 2I. As shown in FIG. 2I, the passivation layer 140 is deposited over the passivation layer 130, the conductive pads 132, and the seed layer 134. In an embodiment, the passivation layer 140 may include a same or a similar material as the passivation layer 130. In an embodiment, the passivation layer 140 includes a dielectric material, such as silicon oxide ($SiO_2$), silicon nitride ($Si_3N_4$), silicon oxynitride (SiON), or a combination thereof, and may include one layer of a dielectric material or multiple layers of dielectric materials. The passivation layer 140 may be formed by CVD, PECVD, flowable CVD, or other suitable methods. The seed layer 134 is encapsulated between the conductive pads 132 and the passivation layer 140. The method 10 may proceed to further steps with respect to the structure 100, such as packaging or bonding, which will be discussed with reference to FIGS. 5 and 7 later.

Figure 3:
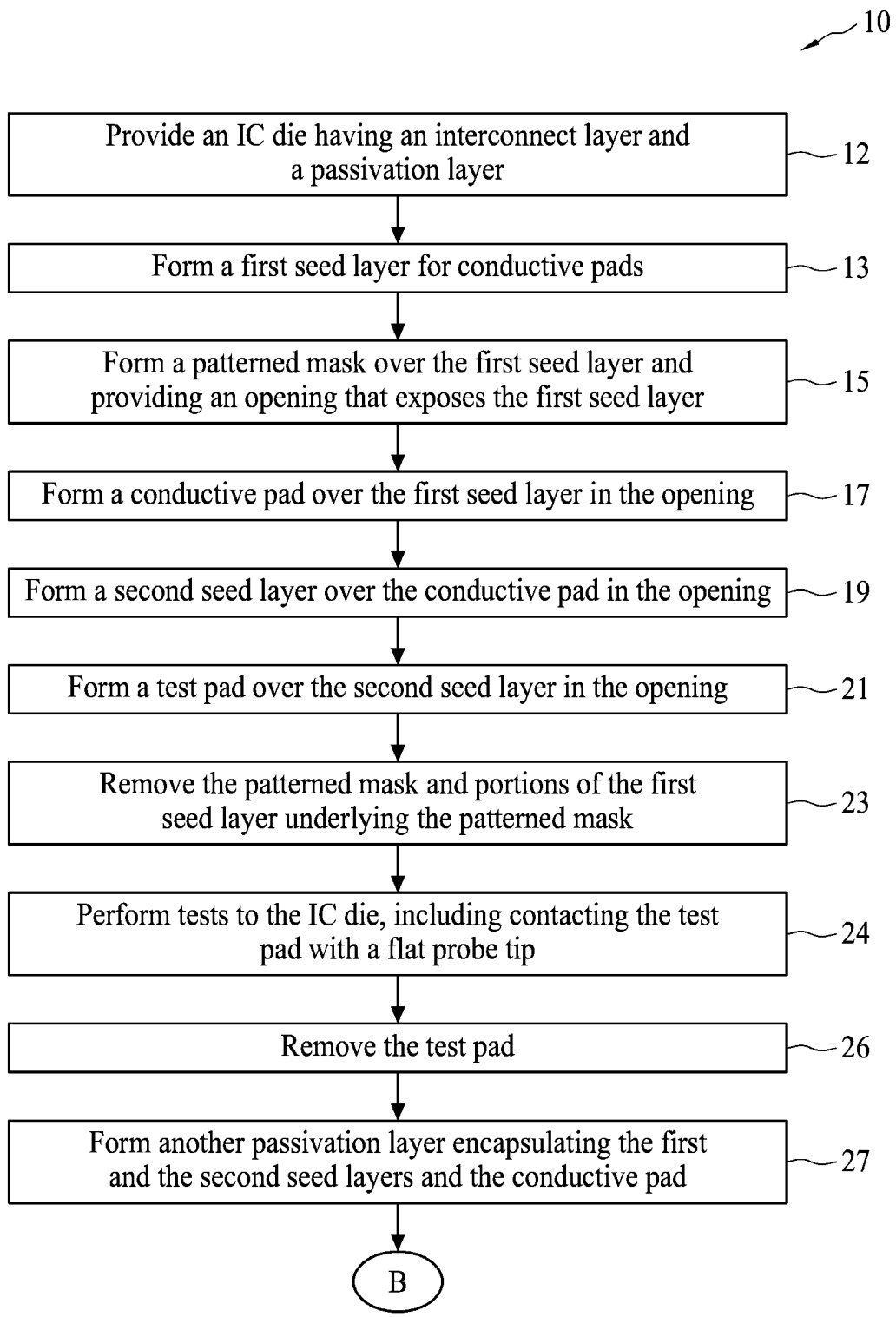
FIG. 3 shows a flow chart of a method of manufacturing wafer and IC according to another embodiment of the present disclosure.

FIG. 3 shows a flow chart of a method 10 of manufacturing a semiconductor structure 100, according to another embodiment of the present disclosure. The method 10 in FIG. 3 is merely an example, and is not intended to limit the present disclosure beyond what is explicitly recited in the claims. Additional operations can be provided before, during, and after the method 10, and some operations described can be replaced, eliminated, or moved around for additional embodiments of the method. The method 10 is described below in conjunction with FIGS. 4A-4J.

Figure 4A:
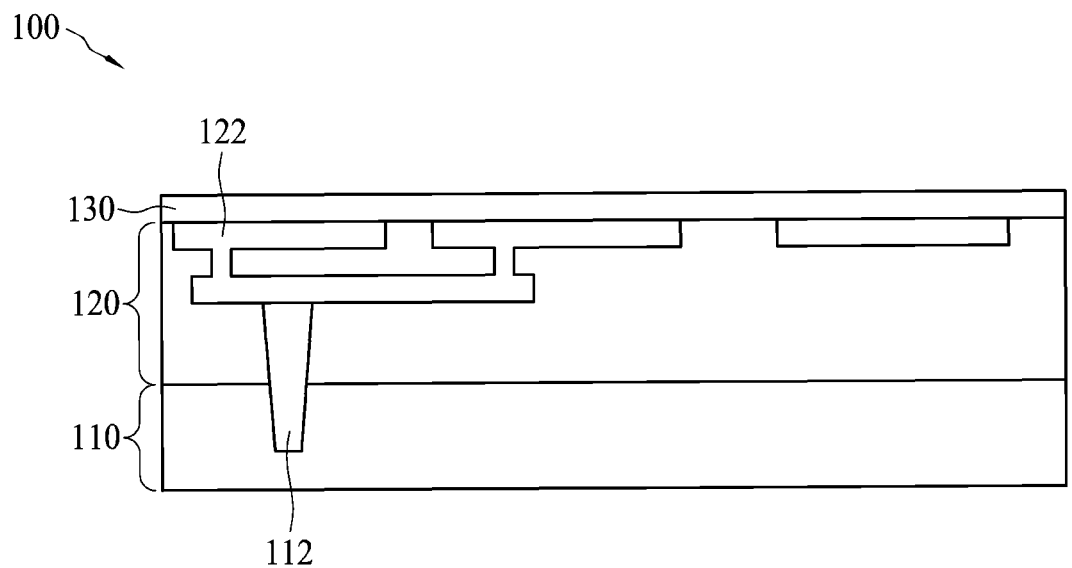
FIGS. 4A, 4B, 4C, 4D, 4E, 4F, 4G, 4H, 4I, and 4J are cross-sectional views of a portion of a semiconductor device, during various manufacturing stages according to the method in FIG. 3 in accordance with embodiments of the present disclosure.

At operation 12, the method 10 (FIG. 3) provides or is provided with a structure 100 during an intermediate fabrication stage. In an embodiment, the structure 100 is a semiconductor wafer with one or more IC dies formed thereon. Referring to FIG. 4A, the structure 100 includes a device layer 110, an interconnect layer 120 over the device layer 110, and a passivation layer 130 over the interconnect layer 120. The operation 12 in FIG. 3 is the same as the operation 12 in FIG. 1.

Figure 4B:
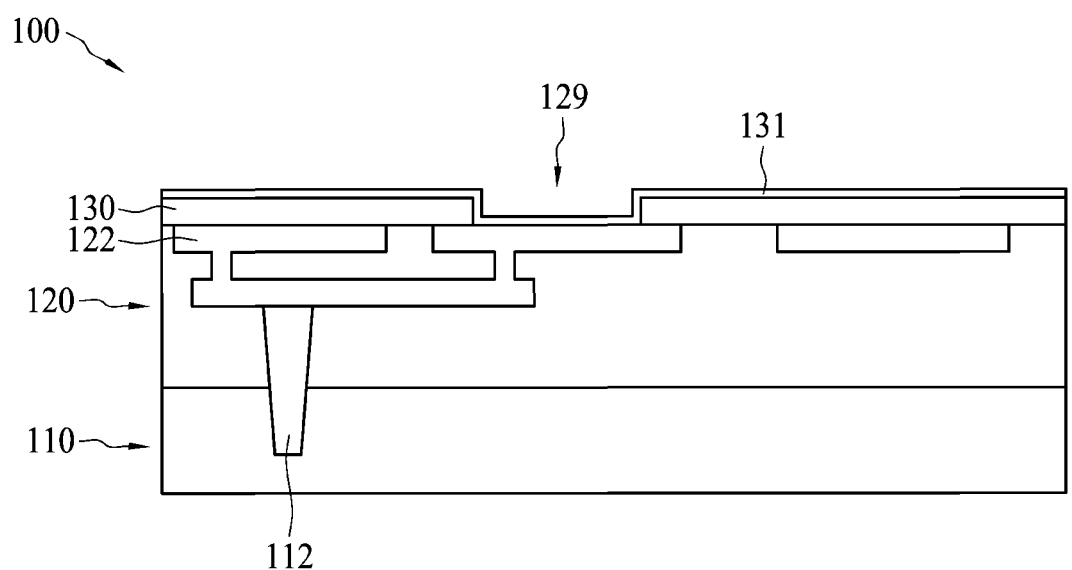

At operation 13, the method 10 (FIG. 3) forms a seed layer 131 over the passivation layer 130, such as shown in FIG. 4B according to an embodiment. The seed layer 131 is deposited on the top surface of the passivation layer 130 and over sidewalls and bottom surfaces of openings 129 (one shown in FIG. 4B) in the passivation layer 130. The seed layer 131 electrically connects to the top metal layer in the interconnect layer 120 through the openings 129. In an embodiment, operation 13 includes patterning the passivation layer 130 using photolithography and etching processes to create openings 129 therein. The openings 129 expose areas of the top metal layer in the interconnect layer 120. Subsequently, operation 13 includes depositing the seed layer 131 in the openings 129 and over the top surface of the passivation layer 130. In an embodiment, the seed layer 131 acts as a seed for subsequent copper deposition for conductive pads 132 (FIG. 4D). For example, the seed layer 131 may include titanium and copper. For example, the seed layer 131 may include a layer of titanium and a layer of copper over the layer of titanium. The layer of titanium may have a thickness in a range about 500 Å to about 1,000 Å and the layer of copper may have a thickness in a range about 3,000 Å to about 5,000 Å in an embodiment. The layer of titanium acts as an adhesion and barrier layer to avoid copper diffusion, while the layer of copper acts as a seed layer for depositing the conductive pads 132. In various embodiments, the seed layer 131 may comprise copper, copper alloy, aluminum, titanium, titanium alloy, or combinations thereof. The seed layer 131 may comprise one layer or multiple layers of metal, and may be formed by ALD, CVD, or PVD processes.

Figure 4C:
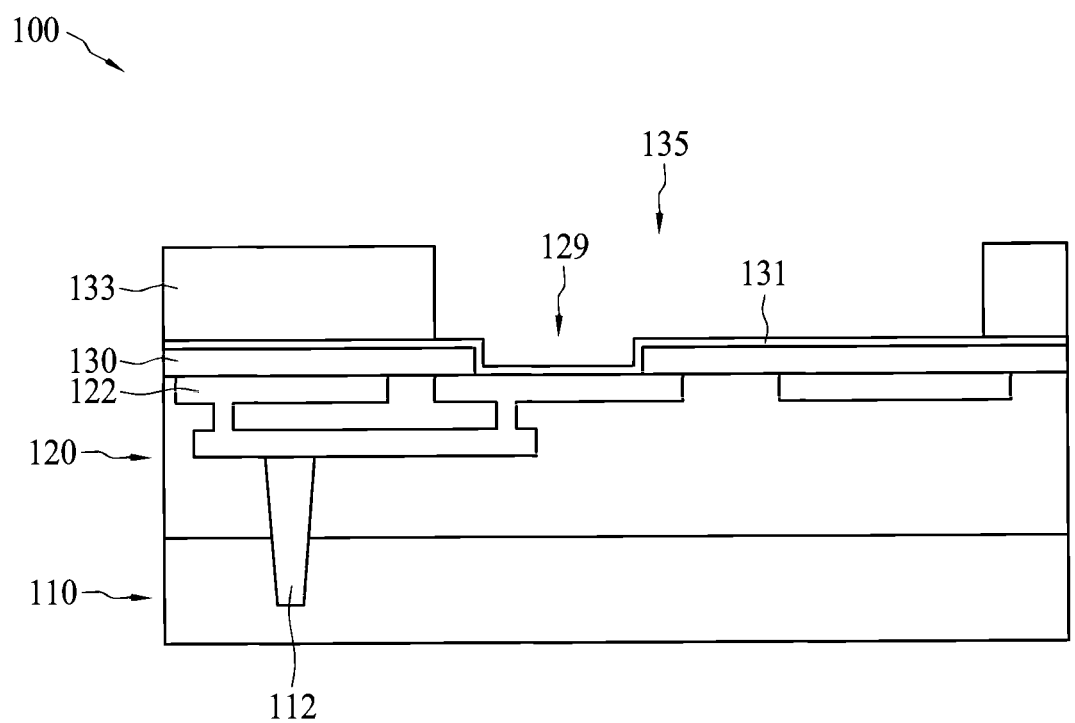
Figure 4D:
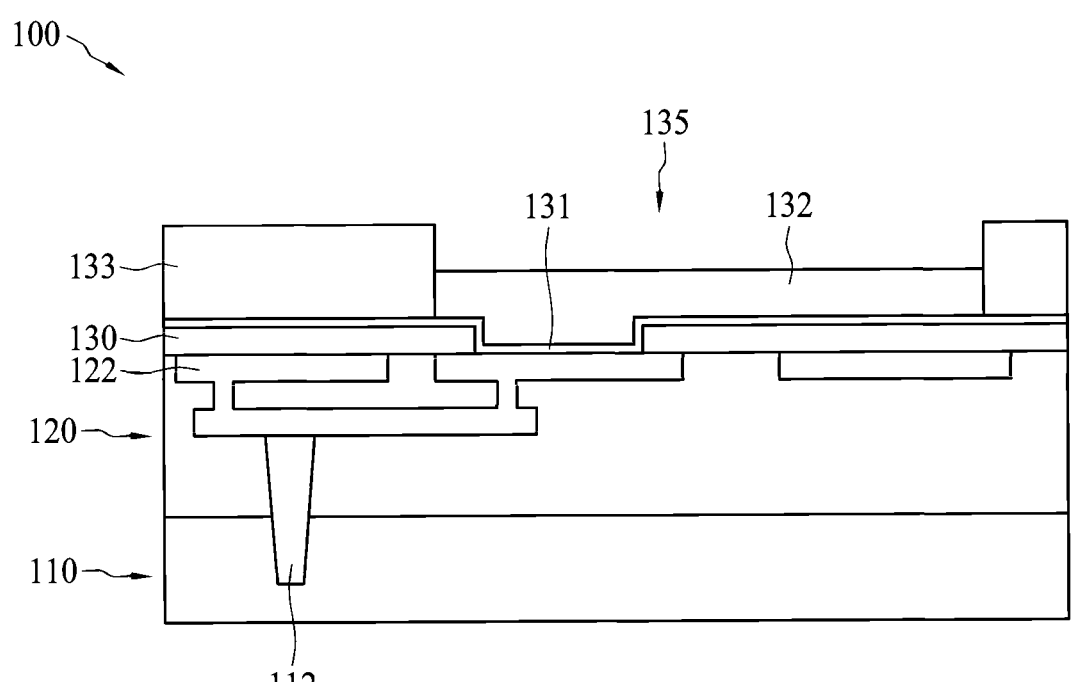

At operation 15, the method 10 (FIG. 3) forms a patterned mask 133 over the seed layer 131, such as shown in FIG. 4C according to an embodiment. The patterned mask 133 provides openings 135 directly over the openings 129 and exposing a portion of the seed layer 131. Each opening 135 is greater than a corresponding opening 129 from the top view. The size and shape of the opening 135 are designed appropriately for conductive pads 132 (FIG. 4D). In an embodiment, the patterned mask 133 is formed using processes including deposition, photolithography, and etching.

In an embodiment, the patterned mask 133 includes a patterned photoresist (or resist). In another embodiment, the patterned mask 133 includes a patterned resist over a patterned anti-reflective coating (ARC) layer. The patterned mask 133 may include other materials in various embodiments. The material(s) of the patterned mask 133 is selected to provide etch selectivity with respect to the passivation layer 130, the seed layer 131, and the conductive pads 132. For example, the patterned mask 133 can be etched or removed in an etching process that has no or minimal etching to the passivation layer 130 and the conductive pads 132.

At operation 17, the method 10 (FIG. 3) forms conductive pads 132 over the seed layer 131, such as shown in FIG. 4D according to an embodiment. A portion of the conductive pad 132 is deposited to fill the opening 129 and another portion of the conductive pad 132 is deposited above the passivation layer 130. The shape and size of the conductive pads 132 are confined by the shape and size of the openings 135. The conductive pad 132 electrically connects to the top metal layer in the interconnect layer 120 through the seed layer 131. In an embodiment, the conductive pads 132 include copper (Cu), and may be referred to as copper (Cu) pads. In alternative embodiments, the conductive pads 132 may include other conductive materials such as aluminum, aluminum copper alloy (AlCu), or titanium (Ti). In embodiments, the conductive pads 132 may be deposited using electro plating, electro-less plating, CVD, PVD, or other deposition techniques, and may have a thickness in a range about 2 μm to about 5 μm.

Figure 4E:
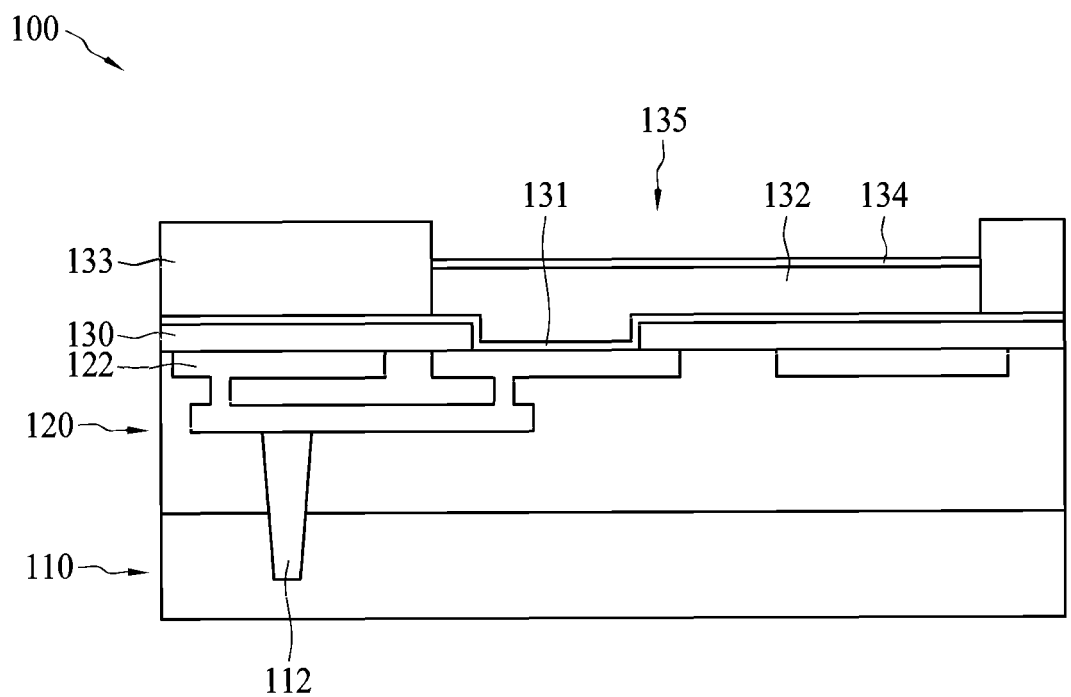
Figure 4F:
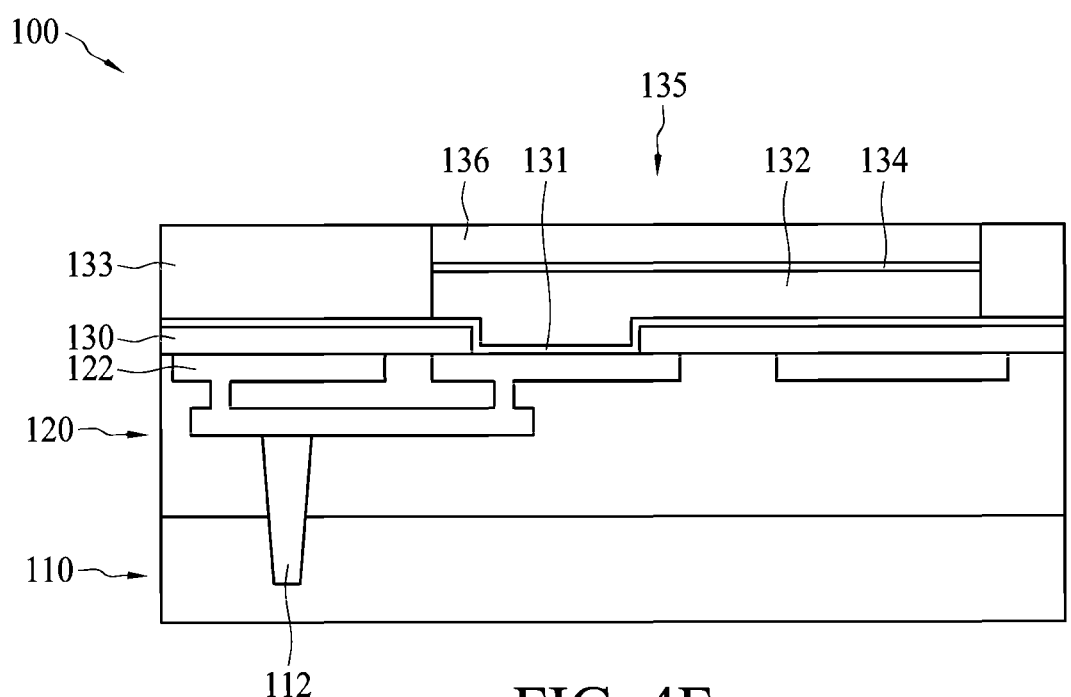

At operation 19, the method 10 (FIG. 3) forms another seed layer 134 in the openings 135 and on the conductive pads 132, such as shown in FIG. 4E. In an embodiment, the seed layer 134 is formed directly on the conductive pads 132. In an embodiment, the seed layer 134 functions as a stress buffer between the conductive pads 132 and subsequently deposited sacrificial test pads 136 (FIG. 4F). Thus, the selection of the material(s) for the seed layer 134 depends on the material(s) of the conductive pads 132 and the sacrificial test pads 136. In an embodiment, the conductive pads 132 includes copper, the seed layer 134 includes nickel, and the sacrificial test pads 136 include tin or other suitable solder material. For example, the layer of nickel may have a thickness in a range of about 500 nm to about 1,000 nm. In various embodiments, the seed layer 134 includes other suitable materials such as a layer of titanium nitride. The seed layer 134 may be deposited using ALD, PVD, or CVD. In an embodiment of the method 10, the operation 19 is optional, and the seed layer 134 may be omitted.

At operation 21, the method 10 (FIG. 3) forms sacrificial test pads 136 over the seed layer 134, such as shown in FIG. 4F. In an embodiment of the method 10 where the seed layer 134 is omitted, the sacrificial test pads 136 are deposited directly on the conductive pads 132. In an embodiment, the sacrificial test pads 136 include a soft material so that they can be contacted by flat probe tips for testing. In an embodiment, the sacrificial test pads 136 include a material softer than aluminum. In an embodiment, the sacrificial test pads 136 include tin (Sn). In alternative embodiments, the sacrificial test pads 136 include lead tin alloy (PbSn). The PbSn alloy may have a high lead to tin ratio (more lead than tin) such as about 95% lead and about 5% tin in an embodiment. The PbSn alloy may have a low lead to tin ratio (less lead than tin) such as about 37% lead and about 63% tin in an embodiment or about 40% lead and about 60% tin in another embodiment. In some embodiments, the sacrificial test pads 136 include a lead-free solder material such as a compound having tin (Sn), silver (Ag), and copper (Cu). In a further embodiment, the compound further includes Zinc (Zn), making a Sn—Ag—Cu—Zn compound. In another further embodiment, the compound further includes manganese (Mn), making it a Sn—Ag—Cu—Mn compound. The sacrificial test pads 136 may include other material(s) in various embodiments. In embodiments, the sacrificial test pads 136 may be deposited using electro plating, electro-less plating, or other deposition techniques, and may have a thickness in a range about 1 μm to about 2 μm.

Figure 4G:
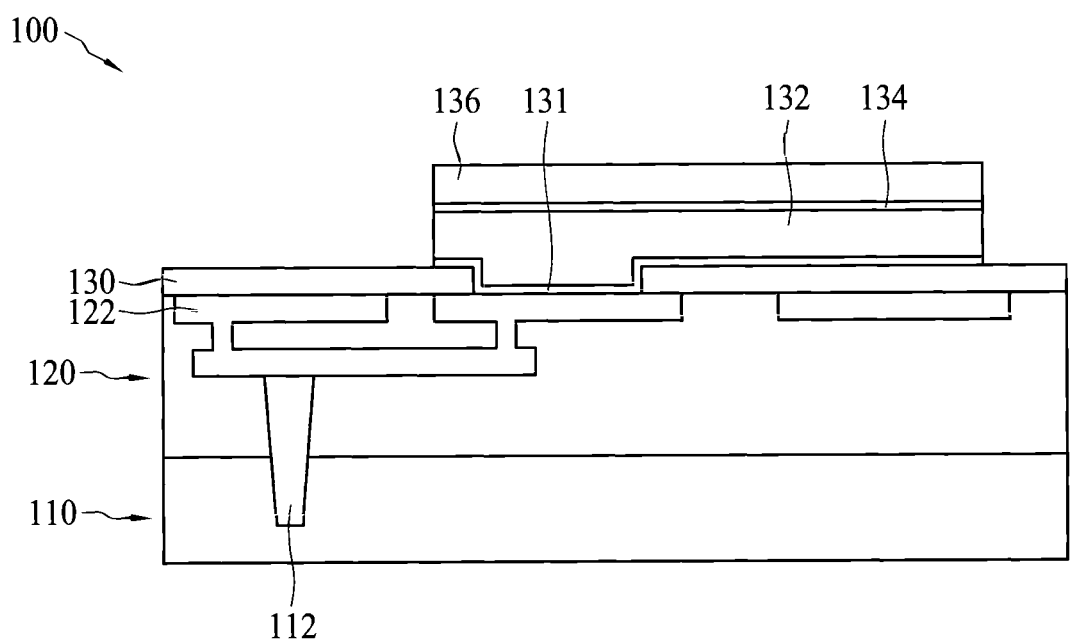

At operation 23, the method 10 (FIG. 3) removes the patterned mask 133 as well as the portion of the seed layer 131 that is directly under the patterned mask 133, such as shown in FIG. 4G. In the embodiment depicted in FIG. 4G, the remaining seed layer 131, the conductive pads 132, the seed layer 134 if present, and the sacrificial test pads 136 are co-extensive from the top view. In an embodiment, the operation 23 may use a first method to remove the patterned mask 133 and a second method to remove the portion of the seed layer 131 that is directly under the patterned mask 133. For example, in an embodiment, the patterned mask 133 is a patterned resist and can be removed using resist stripping, and the portion of the seed layer 131 is removed using an etching process that is selective to the material(s) of the seed layer 131 and with little to no etching to the sacrificial test pads 136, the passivation layer 130, the seed layer 134 if present, and the conductive pad 132. The etching may be dry etching, wet etching, or other suitable etching methods.

Figure 4H:
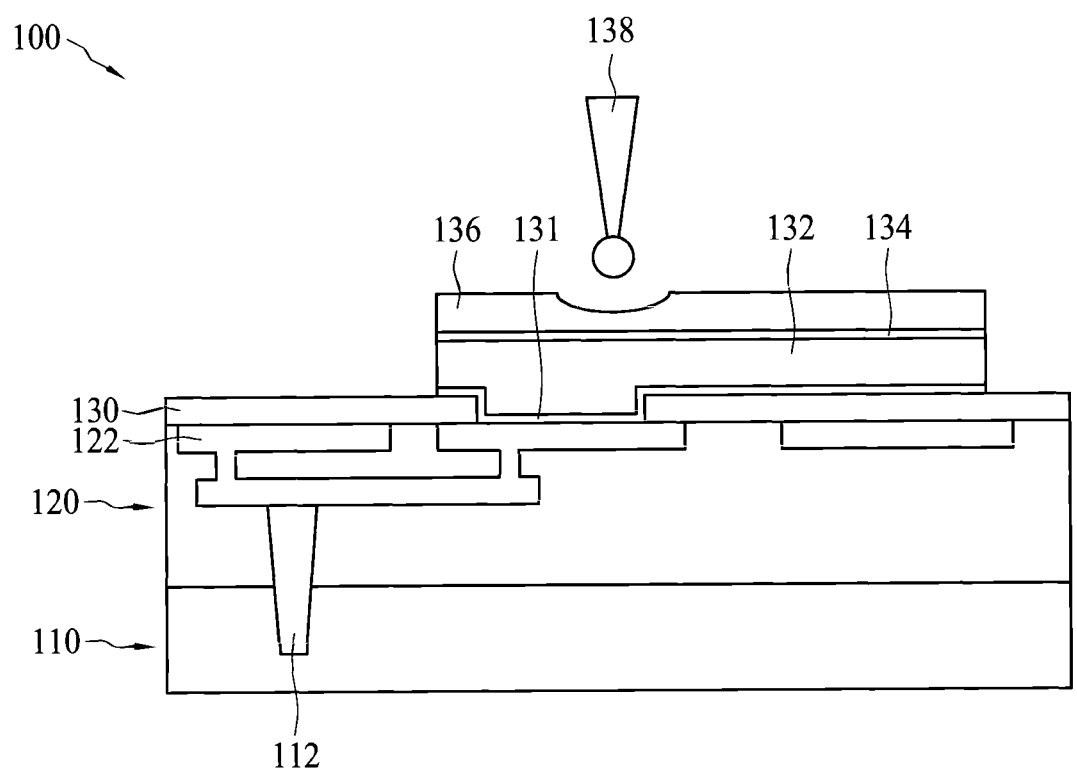
Figure 4I:
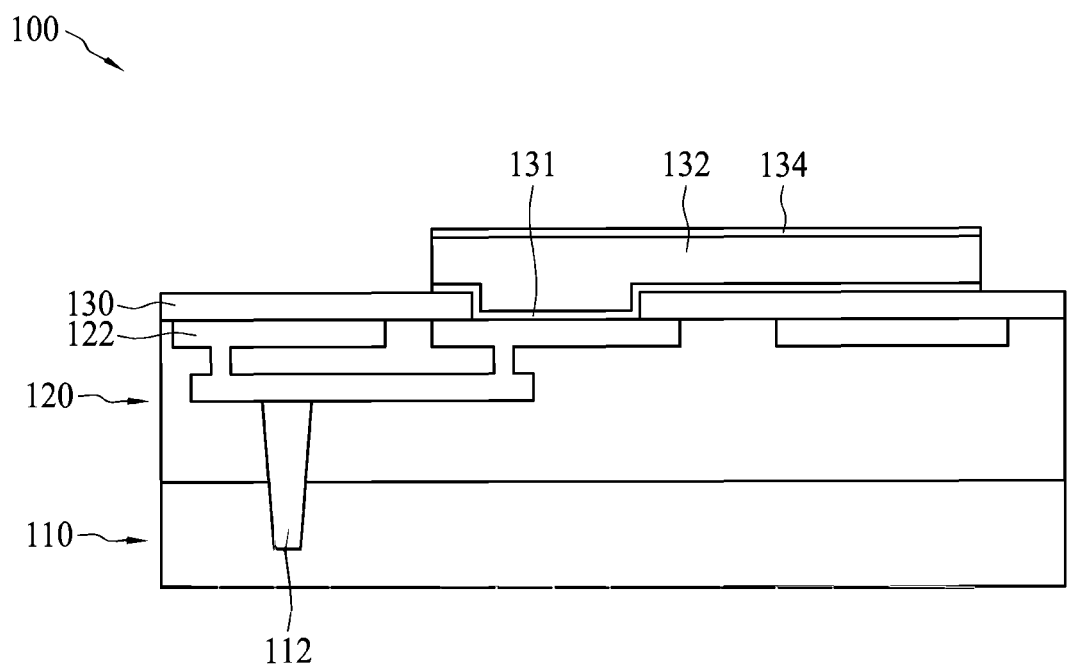

At operation 24, the method 10 (FIG. 3) performs testing to the structure 100 by contacting probe tips 138 to the sacrificial test pads 136, such as illustrated in FIG. 4H. This is the same as the operation 24 in FIG. 1. At operation 26, the method 10 (FIG. 3) removes the sacrificial test pads 136 after finishing the testing of the structure 100, such as shown in FIG. 4I. The seed layer 134, if present, is disposed on the conductive pad 132 which is disposed on the seed layer 131. Other aspects are the same as the operation 26 in FIG. 1.

Figure 4J:
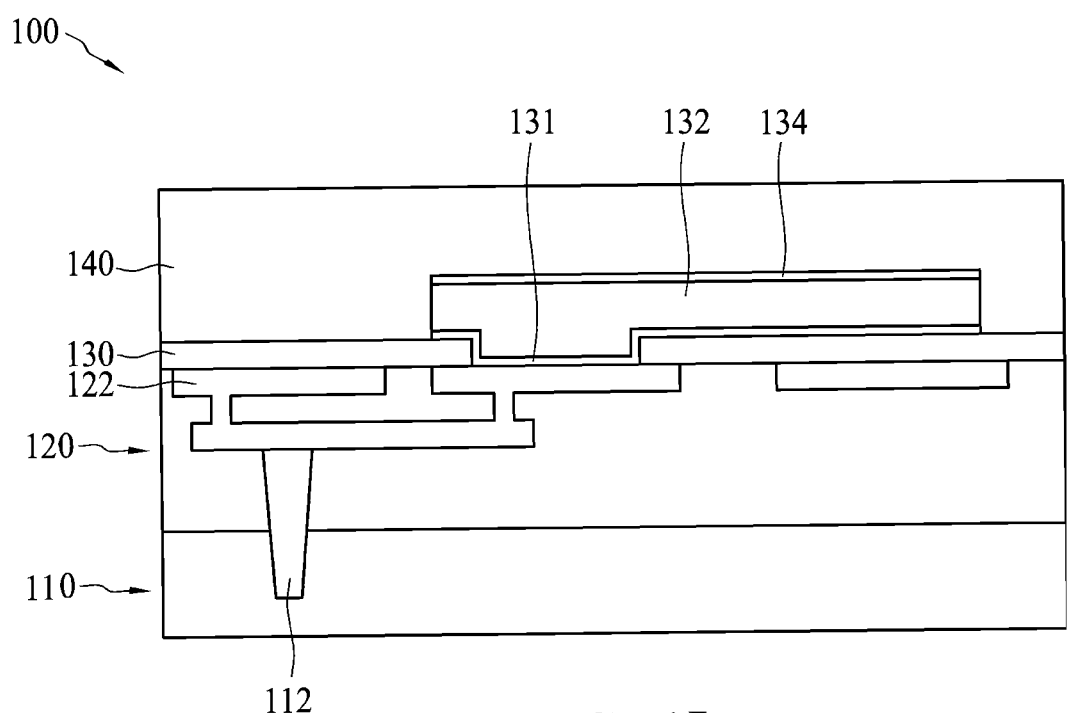

At operation 27, the method 10 (FIG. 3) forms a passivation layer 140 over the passivation layer 130 and encapsulating the seed layer 134 if present, the conductive pads 132, and the seed layer 131, such as shown in FIG. 4J. Other aspects of the operation 27 are the same as those of the operation 28.

Figure 5:
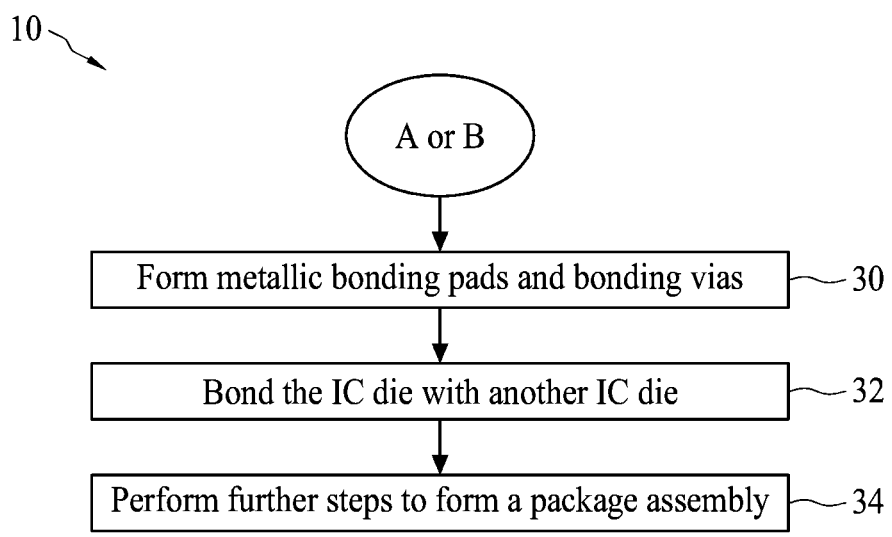
FIG. 5 shows a flow chart of a method of manufacturing wafer and IC according to an embodiment of the present disclosure.
Figures 1, 6A:
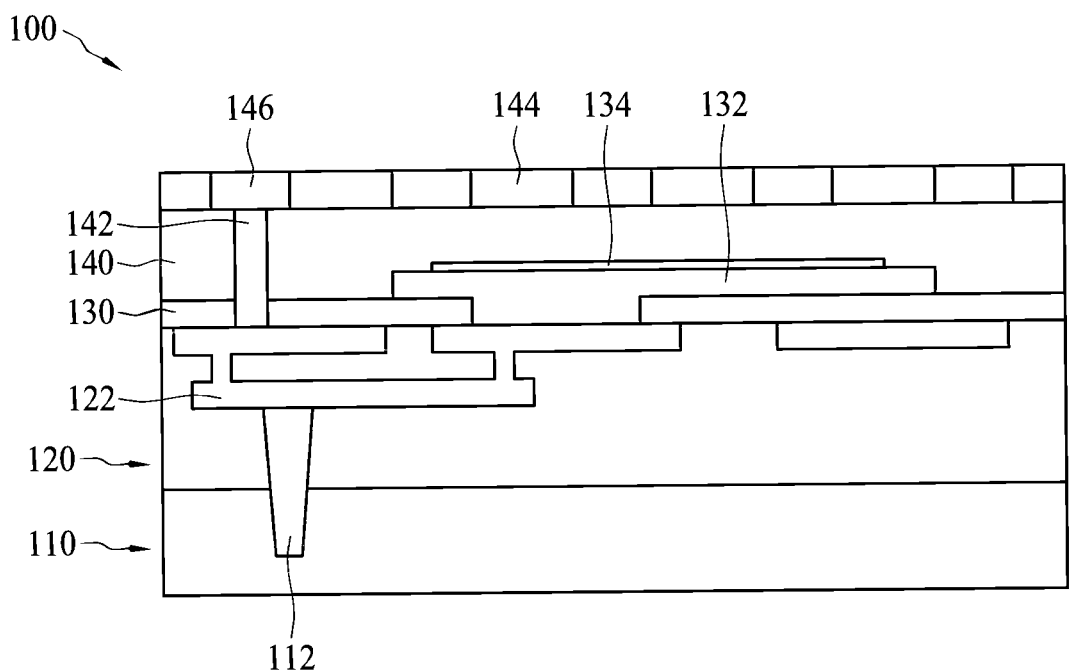
Figures 2, 6A:
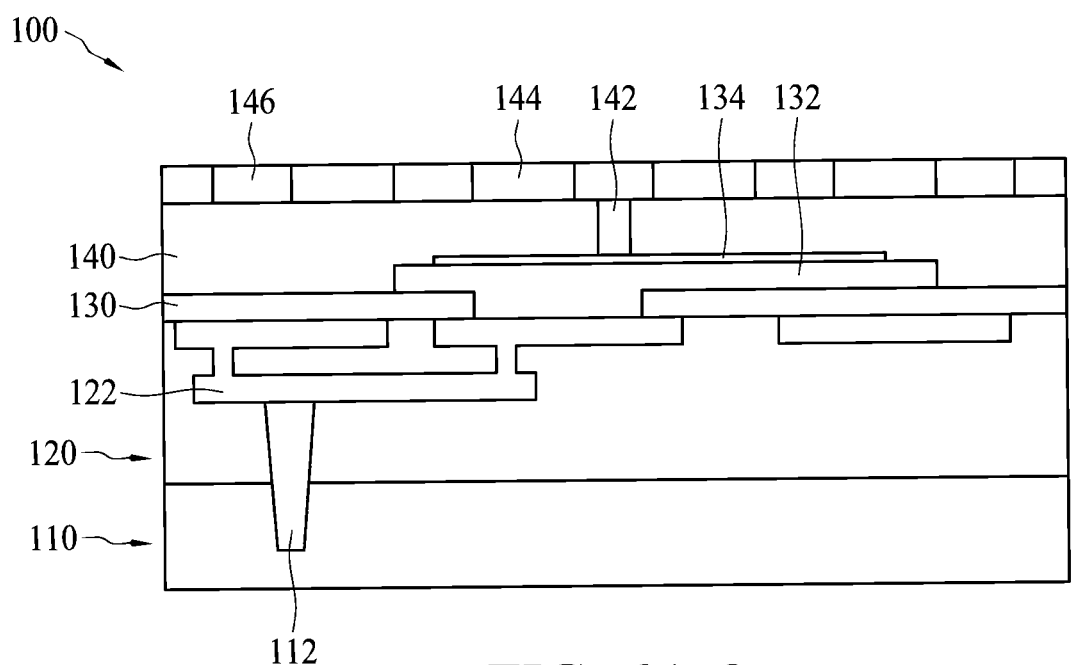
Figures 3, 6A:
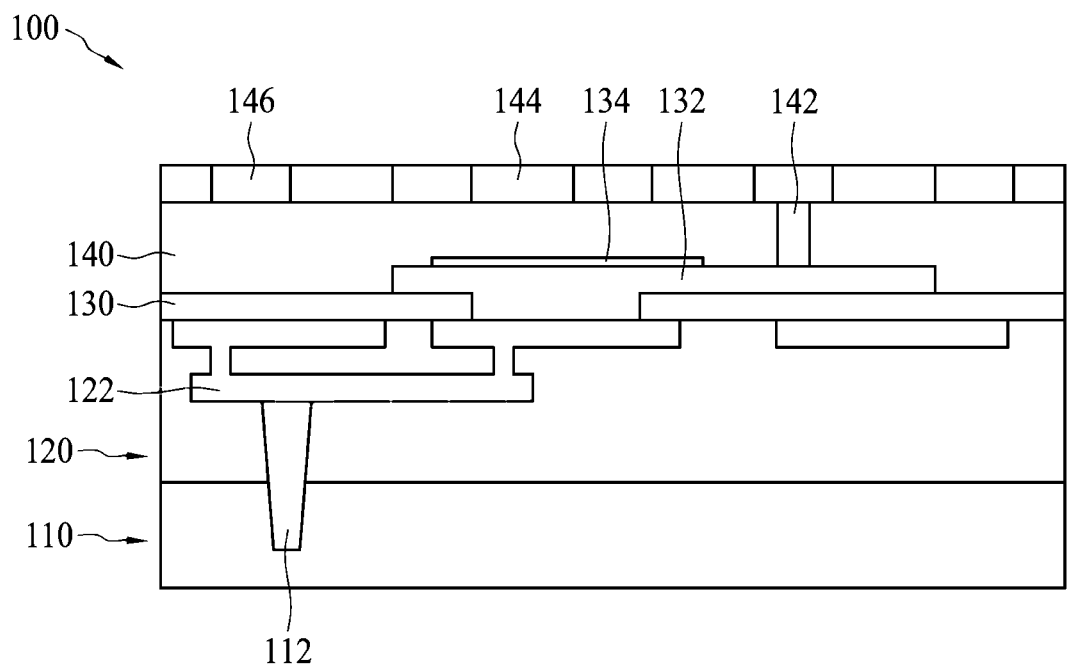
Figures 4, 6A:
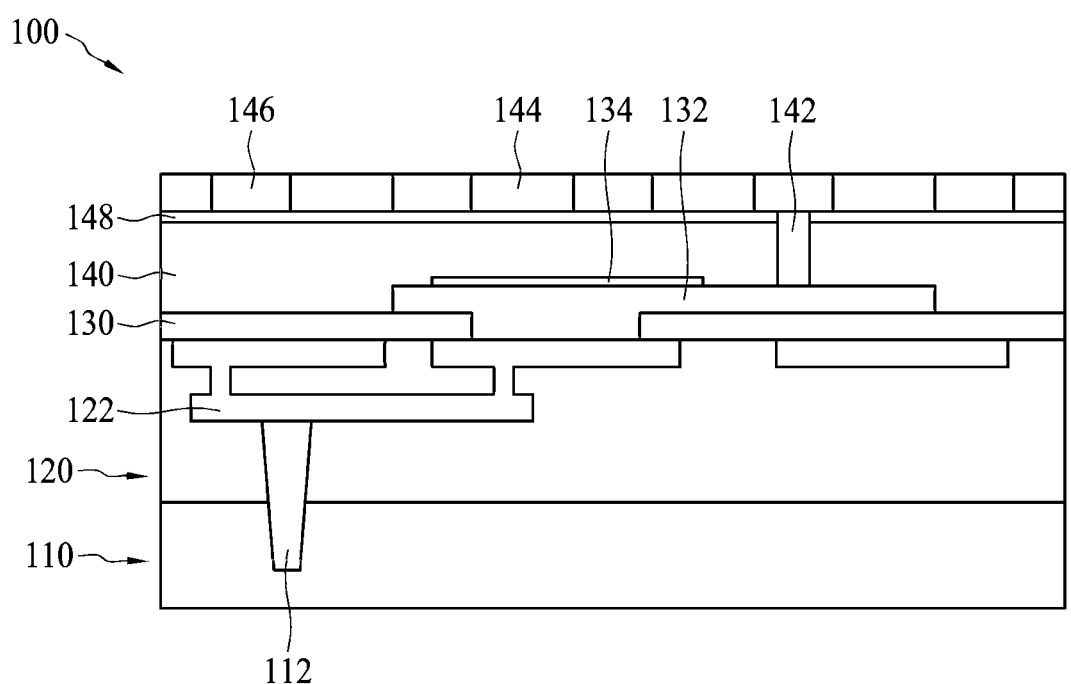

From either the operation 28 (FIG. 1) or the operation 27 (FIG. 3), the method 10 may continue further processing to the structure 100. An embodiment of the method 10 for such further processing is shown in FIG. 5, and another embodiment of the method 10 for such further processing is shown in FIG. 7. The method 10 in FIGS. 5 and 7 are merely examples, and are not intended to limit the present disclosure beyond what is explicitly recited in the claims. Additional operations can be provided before, during, and after the method 10 in FIGS. 5 and 7, and some operations described can be replaced, eliminated, or moved around for additional embodiments of the method. The embodiment of the method 10 in FIG. 5 is described below in conjunction with FIGS. 6A-1~4, 6B-1~4, and 6C. The embodiment of the method 10 in FIG. 7 is described below in conjunction with FIGS. 8A-1~2 and 8B-1~2.

Referring to FIG. 5, the method 10 proceeds from either the operation 28 (FIG. 1 and FIG. 2I) or the operation 27 (FIG. 3 and FIG. 4J) to operation 30. At the operation 30, the method 10 forms metallic bond pads and bond pad vias. FIGS. 6A-1, 6A-2, 6A-3, and 6A-4 illustrate examples of the structure 100 where the operation 30 is performed on the structure 100 shown in FIG. 2I. Referring to FIG. 6A-1, a dielectric layer 144 is formed over the passivation layer 140, bond pads 146 are formed in the dielectric layer 144, and bond pad vias 142 are formed that connect the bond pads 146 to the top metal layer in the interconnect layer 120. The dielectric layer 144 may include silicon oxide ($SiO_2$), silicon nitride ($Si_3N_4$), silicon oxynitride (SiON), a low-k material, or other suitable dielectric materials. The bond pads 146 and the bond pad vias 142 may include a metal, such as copper in an embodiment, and may include other metals or metal alloy such as gold, silver, aluminum, nickel, palladium, tungsten, or a compound thereof in alternative embodiments. The top metal layer in the interconnect layer 120 may include the same or different material as the bond pads 146 and the bond pad vias 142. Referring to FIG. 6A-2, in this embodiment, at least one bond pad via 142 is landed on the seed layer 134 and connects a bond pad 146 to the seed layer 134 and the conductive pad 132. Referring to FIG. 6A-3, in this embodiment, at least one bond pad via 142 is landed on the conductive pad 132 at an area that is not covered by the seed layer 134. The area on the conductive pad 132 for landing the bond pad via 142 may be defined by covering such area(s) by the patterned mask 133 (FIG. 2C). Referring to FIG. 6A-4, in this embodiment, the operation 30 further forms an etch stop layer 148 between the passivation layer 140 and the dielectric layer 144. The etch stop layer 148 includes a different dielectric material than the dielectric layer 144, and may include silicon oxide ($SiO_2$), silicon nitride ($Si_3N_4$), silicon oxynitride (SiON), or other suitable dielectric materials. Any of the features shown in FIGS. 6A-1, 6A-2, 6A-3, and 6A-4 may be combined to form additional embodiments of the structure 100. For example, in some embodiments, the structure 100 includes some bond pad vias 142 disposed on the top metal layer of the interconnect layer 120, some bond pad vias 142 disposed on the seed layer 134, and some bond pad vias disposed on the conductive pads 132. For example, any of the embodiments shown in FIGS. 6A-1, 6A-2, and 6A-3 may further include the etch stop layer 148.

Figures 1, 6B:
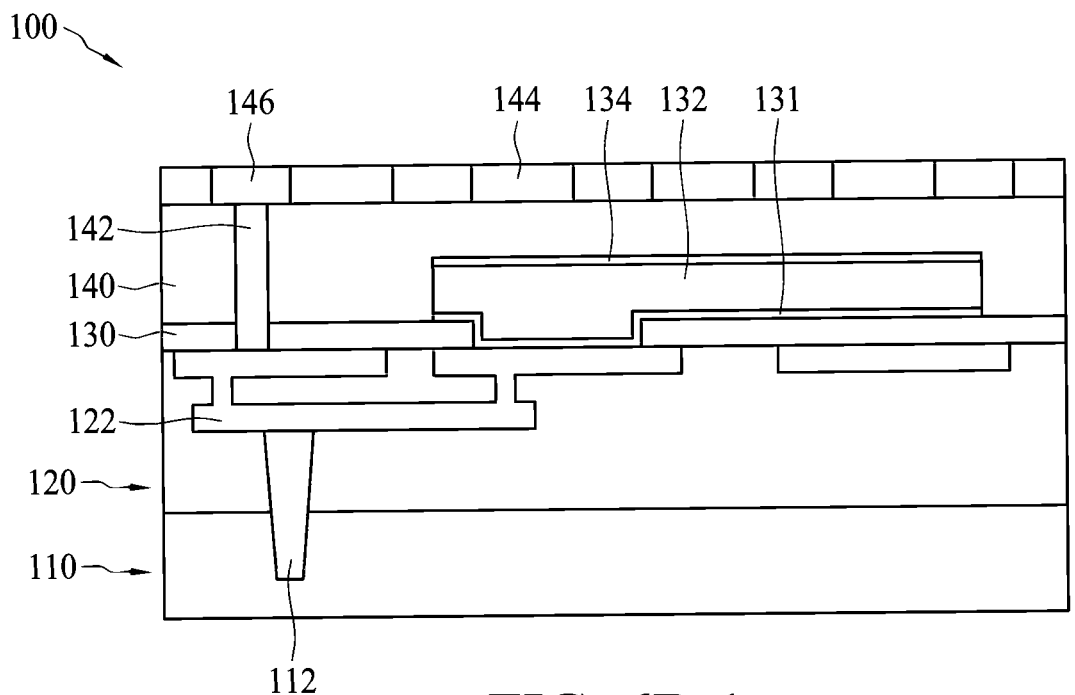
Figures 2, 6B:
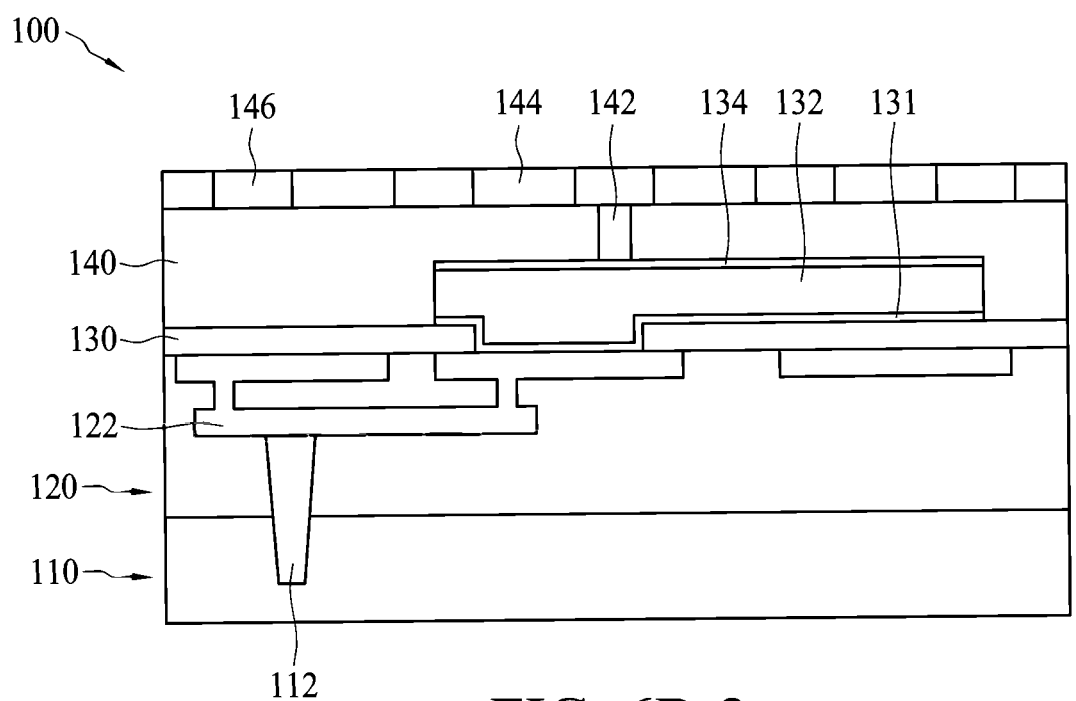
Figures 3, 6B:
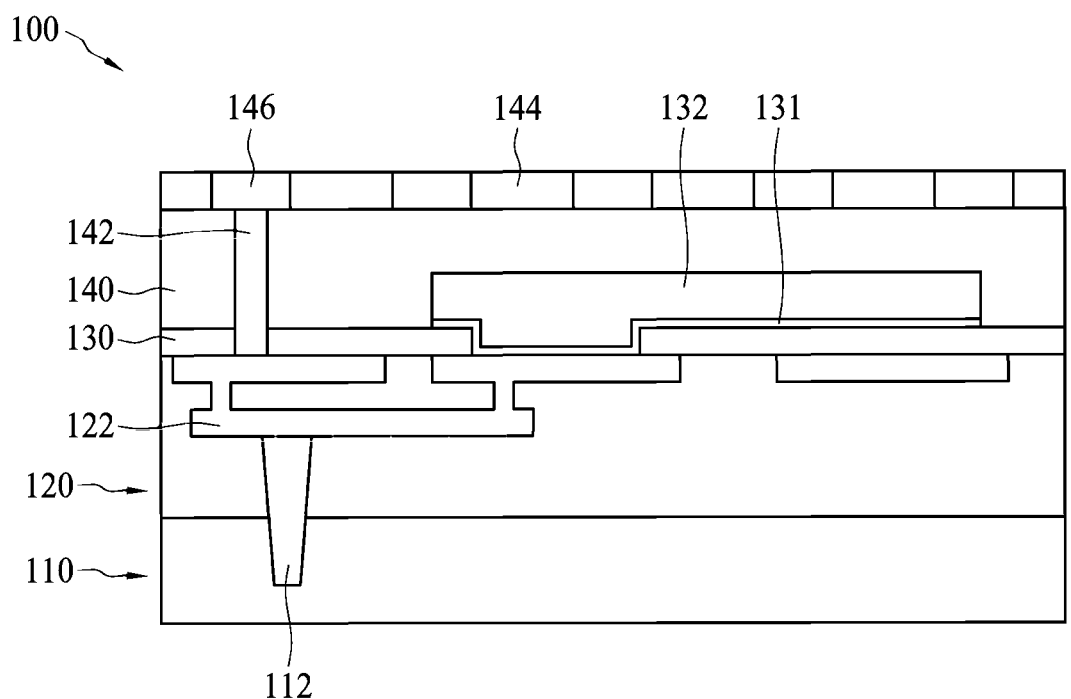
Figures 4, 6B:
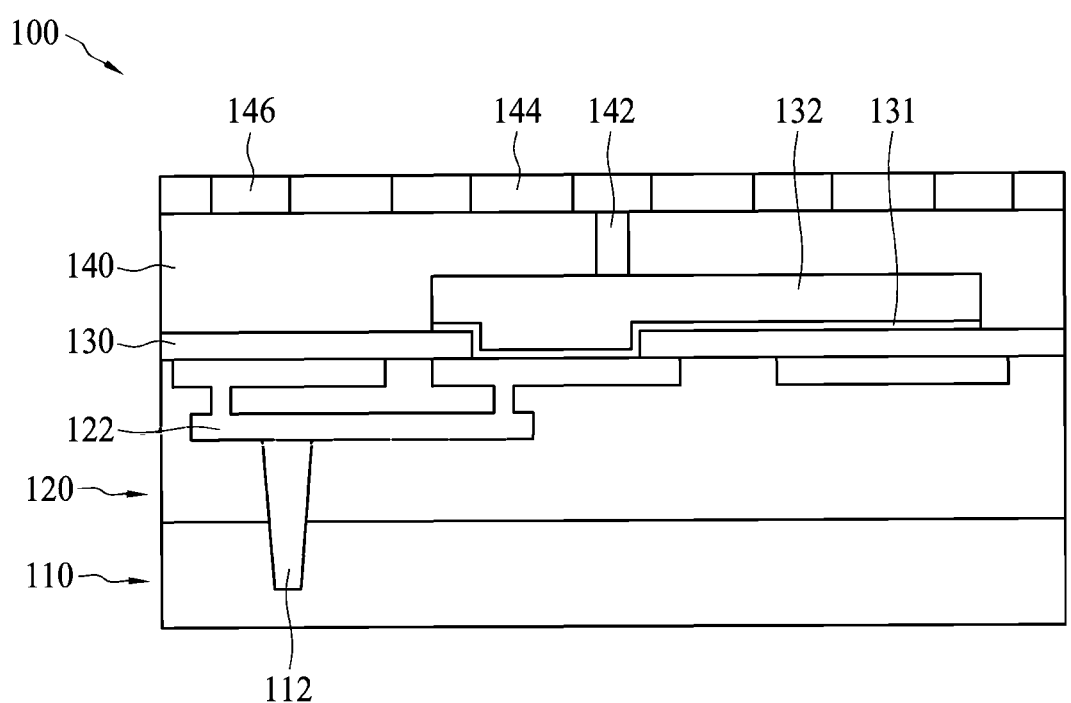
Figure 7:
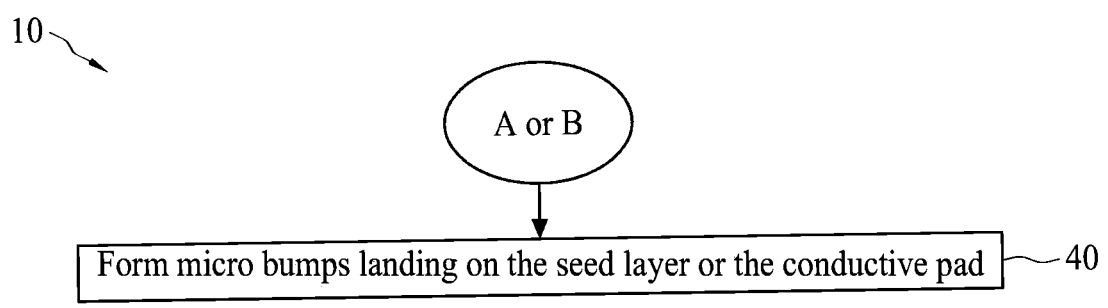
FIG. 7 shows a flow chart of a method of manufacturing wafer and IC according to an embodiment of the present disclosure.

FIGS. 6B-1, 6B-2, 6B-3, and 6B-4 illustrate examples of the structure 100 where the operation 30 is performed on the structure 100 shown in FIG. 4J. Referring to FIG. 6B-1, a dielectric layer 144 is formed over the passivation layer 140, bond pads 146 are formed in the dielectric layer 144, and bond pad vias 142 are formed that connect the bond pads 146 to the top metal layer in the interconnect layer 120. The materials for the dielectric layer 144, the bond pads 146, and the bond pad vias 142 have been discussed above. Referring to FIG. 6B-2, in this embodiment, at least one bond pad via 142 is landed on the seed layer 134 and electrically connect to the seed layer 134 and the conductive pad 132. Referring to FIG. 6B-3, in this embodiment, the seed layer 134 is omitted in the structure 100 and at least one bond pad via 142 is landed on the top metal layer in the interconnect layer 120. Referring to FIG. 6B-4, in this embodiment, the seed layer 134 is omitted in the structure 100 and at least one bond pad via 142 is landed on the conductive pad 132. Further, any of the embodiments shown in FIGS. 6B-1, 6B-2, 6B-3, and 6B-4 may further include the etch stop layer 148 between the passivation layer 140 and the dielectric layer 144. Any of the features shown in FIGS. 6B-1, 6B-2, 6B-3, and 6B-4 may be combined to form additional embodiments of the structure 100. For example, in some embodiments, the structure 100 includes some bond pad vias 142 disposed on the top metal layer of the interconnect layer 120 and some bond pad vias 142 disposed on the seed layer 134. For example, in some embodiments, the structure 100 includes some bond pad vias 142 disposed on the top metal layer of the interconnect layer 120 and some bond pad vias disposed on the conductive pads 132.

Figure 6C:
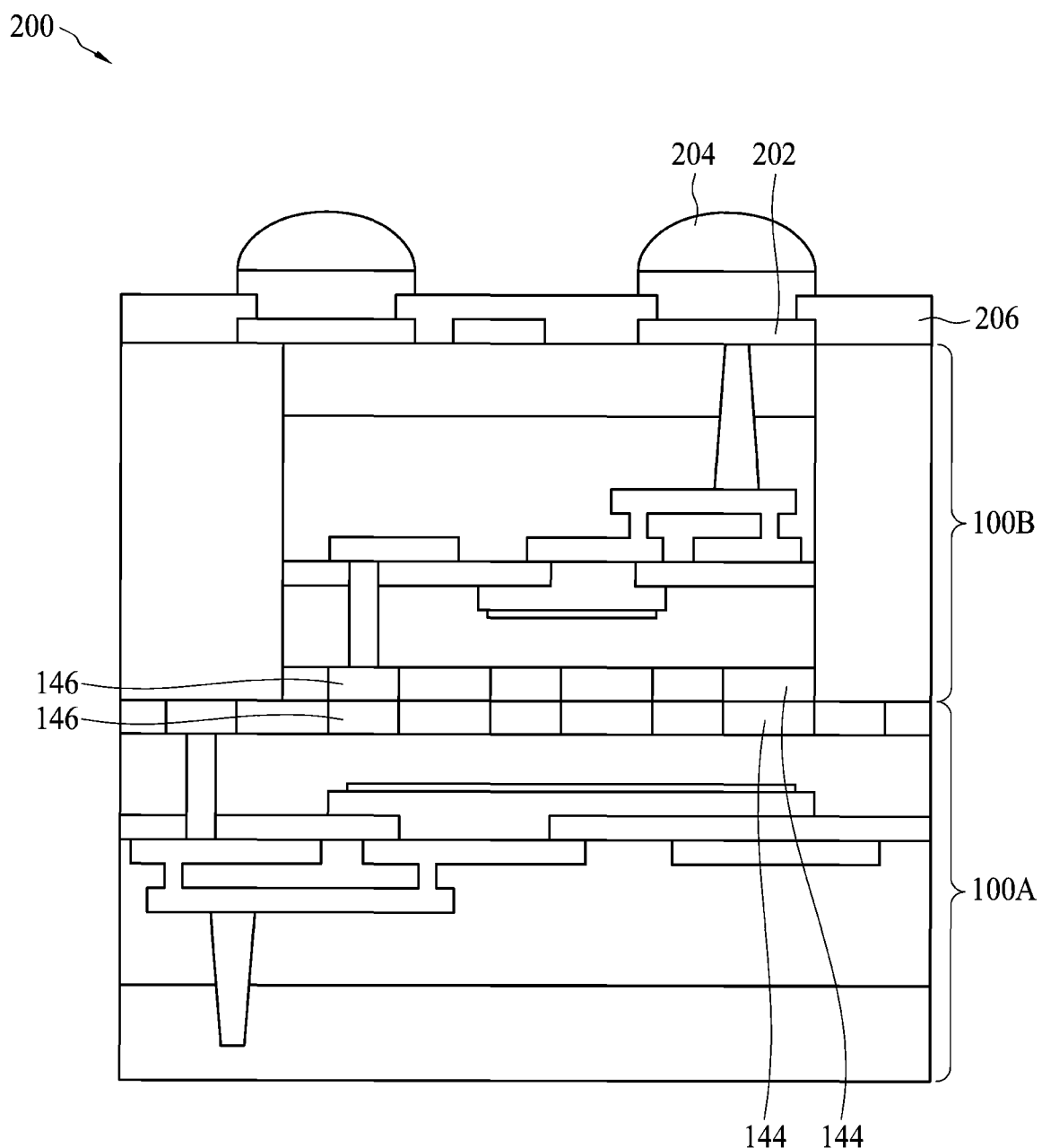

At operation 32, the method 10 (FIG. 5) proceeds to bonding the structure 100 (or known good dies or KGDs) with other structures (or other KGDs) to form a system on integrated chips (SoIC). For example, as illustrated in FIG. 6C, a KGD 100A is bonded to another KGD 100B, for example, using hybrid bond where bond pads 146 on the two KGDs are bonded together while the respective dielectric layers 144 are bonded together. A hybrid bond process refers to bonding of two surfaces where each surface includes at least two substantially different materials (a hybrid surface). In the example shown in FIG. 6C, each of the KGDs 100A and 100B may be in one of forms shown in FIG. 6A-1 through FIG. 6B-4 or other variants manufactured by embodiments of the method 10.

At operation 34, the method 10 (FIG. 5) proceeds to further manufacturing steps. For example, the method 10 may form a packaged assembly encapsulating or including the KGDs bonded in the operation 32, such as the KGD 100A and the KGD 100B. For example, the method 10 may form bond pads 202, bumps or solder balls 204, and passivation layer 206 to create an SoIC 200, such as shown in FIG. 6C.

Figures 1, 8A:
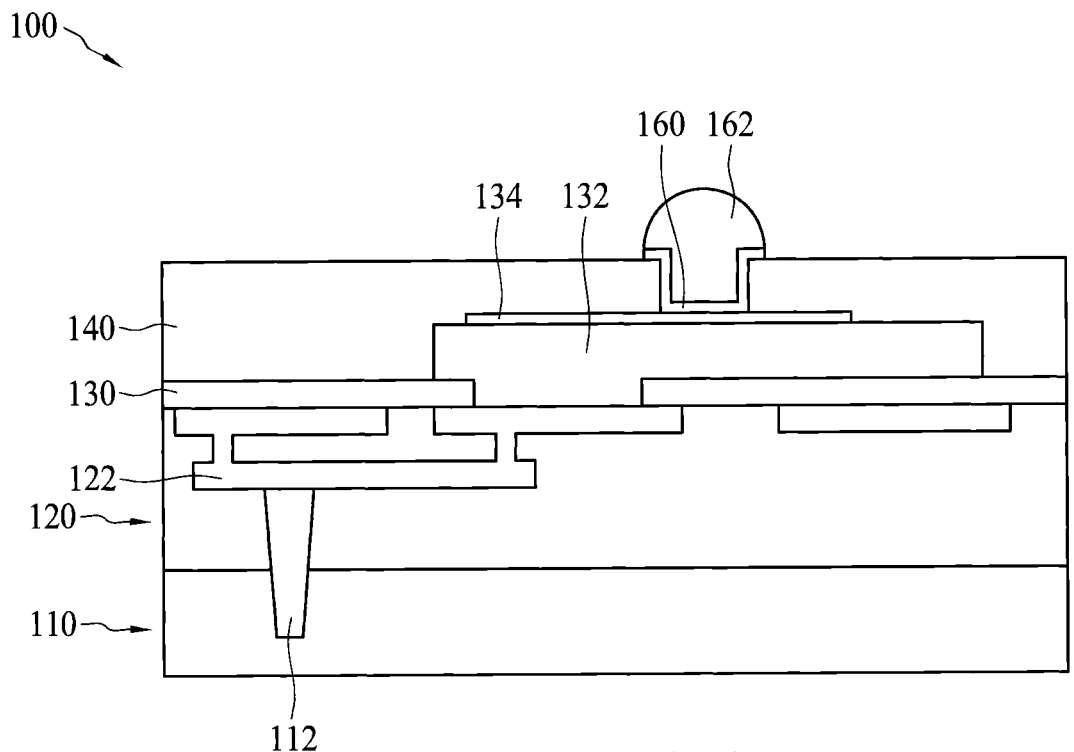
Figures 2, 8A:
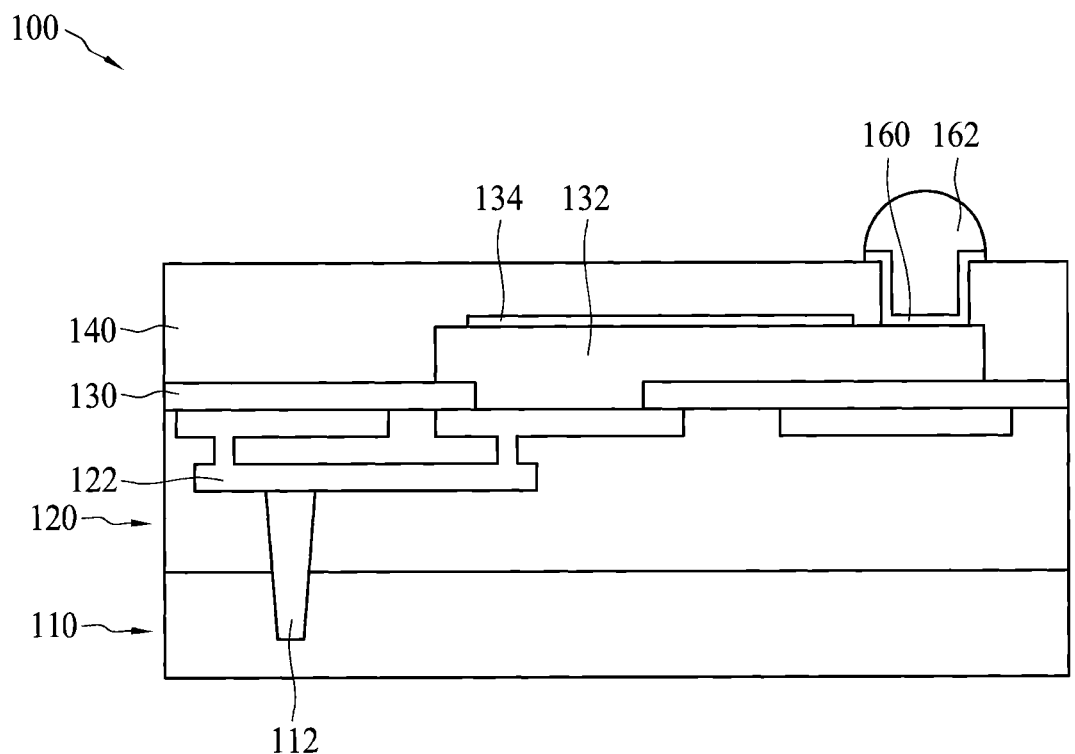
Figures 1, 8B:
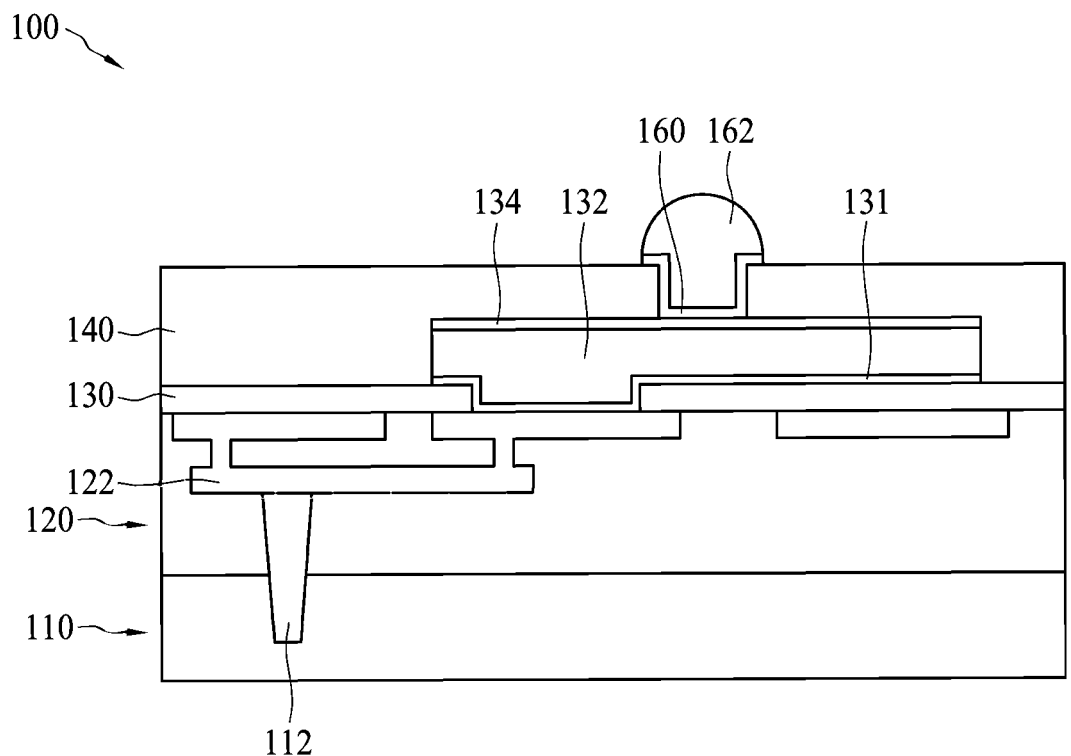
Figures 2, 8B:
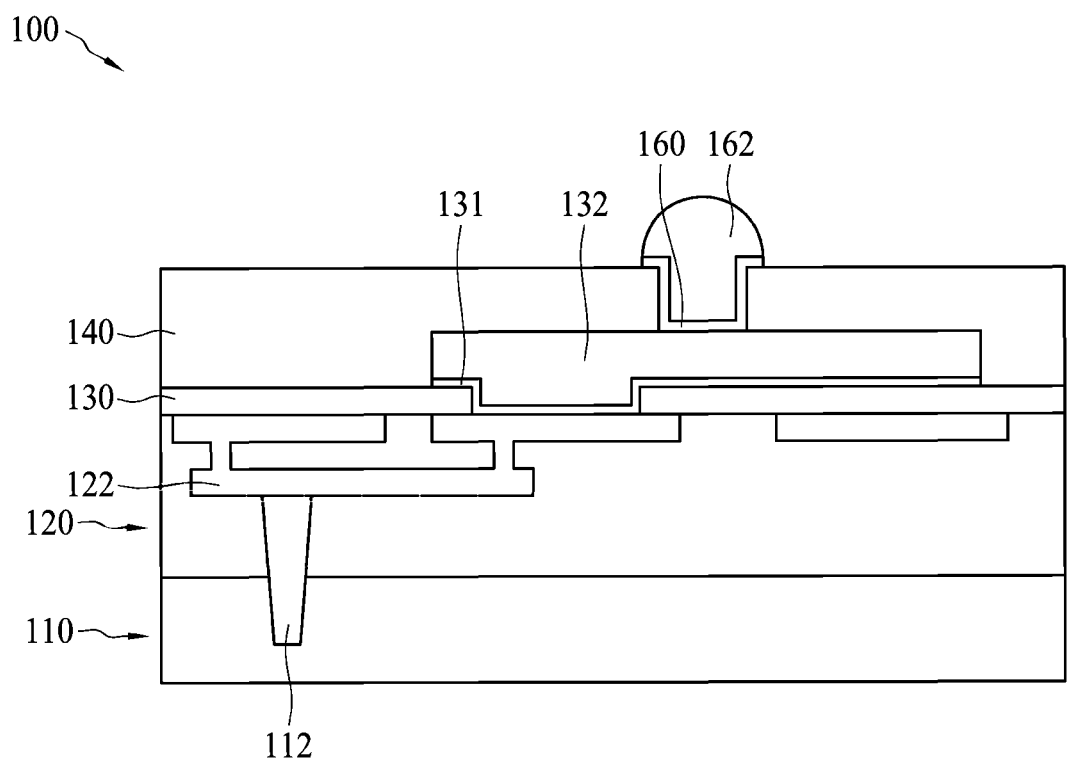

Referring to FIG. 7, the method 10 proceeds from either the operation 28 (FIG. 1 and FIG. 2I) or the operation 27 (FIG. 3 and FIG. 4J) to operation 40. At the operation 40, the method 10 forms micro bumps landing on either the seed layer 134 or the conductive pads 132. FIGS. 8A-1 and 8A-2 illustrate examples of the structure 100 where the operation 40 is performed on the structure 100 shown in FIG. 2I. Referring to FIG. 8A-1, a micro bump 160 is formed to be in direct contact with the seed layer 134, and a solder ball 162 is formed on the micro bump 160. The micro bump 160 may include copper or other suitable metals or metal compounds. The solder ball 162 may include PbSn or a lead-free solder material such as having tin, copper, silver, zinc, and/or other metals. In the present embodiment, the seed layer 134 or the conductive pad 132 are much larger (i.e., having a much larger footprint) than the micro bump 160 and the solder ball 162. In some examples, the footprint of the conductive pad 132 may be at least 5 times greater than the footprint of the micro bump 160. Thus, probing on the sacrificial test pads 136 which has about the same footprint as the conductive pad 132 (such as shown in FIG. 2G and FIG. 4H) is much easier than probing on the micro bump 160 or the solder ball 162. Thus, a majority of the testing may be performed by probing on the sacrificial test pads 136 rather than probing on the micro bump 160 or the solder ball 162 to increase testing throughput. After the testing finishes and the sacrificial test pads 136 are removed, the micro bump 160 and the solder ball 162 are formed. The micro bumps 160 and the solder balls 162 may be landed on the seed layer 134 in an embodiment (shown in FIG. 8A-1) or landed on the conductive pads 132 (shown in FIG. 8A-2) in an alternative embodiment. In some embodiments, some of the micro bumps 160 and the solder balls 162 are landed on the seed layer 134 and some of the micro bumps 160 and the solder balls 162 are landed on the conductive pads 132. FIGS. 8B-1 and 8B-2 illustrate examples of the structure 100 where the operation 40 is performed on the structure 100 shown in FIG. 4J. Referring to FIG. 8B-1, the micro bumps 160 and the solder balls 162 are landed on the seed layer 134 in an embodiment. Referring to FIG. 8B-2, the micro bumps 160 and the solder balls 162 are landed on conductive pads 132 in another embodiment where the seed layer 134 is omitted.

Although not intended to be limiting, one or more embodiments of the present disclosure provide many benefits to a semiconductor device and a formation process thereof. For example, embodiments of the present disclosure can be used for testing IC dies with reduced test time, increased throughput, and reduced costs. For another example, embodiments of the present disclosure allow probe testing on IC dies without leaving marks on the test pads, which simplifies downstream processes. Further, the disclosed methods and structures are compatible with SoC processes and SoIC processes.

In one example aspect, the present disclosure is directed to a device that includes a semiconductor die. The semiconductor die includes a device layer, an interconnect layer over the device layer, a conductive pad over the interconnect layer, a conductive seed layer directly on the conductive pad, and a passivation layer encapsulating the conductive pad and the conductive seed layer.

In an embodiment of the device, the conductive pad includes aluminum and the conductive seed layer includes titanium copper. In another embodiment, the conductive pad includes one of aluminum, aluminum copper, copper, and titanium; and the conductive seed layer includes one of titanium copper, titanium nitride, and nickel.

In some embodiment where the passivation layer is a first passivation layer, the device further includes a second passivation layer over the interconnect layer, wherein the conductive pad penetrating through the second passivation layer and electrically connecting to the interconnect layer, wherein the first passivation layer is disposed over the second passivation layer, the conductive pad, and the conductive seed layer.

In some embodiment, the device further includes a conductive feature that goes through the passivation layer and lands directly on the conductive seed layer. In another embodiment, the device further includes a conductive feature that goes through the passivation layer and lands directly on an area of the conductive pad.

In some embodiments, a top surface of the conductive seed layer is substantially flat. In some embodiments, the device further includes another semiconductor die that is bonded to the semiconductor die.

In another example aspect, the present disclosure is directed to a method that includes providing an integrated circuit (IC) die, wherein the IC die includes an interconnect layer, a first passivation layer over the interconnect layer, and a conductive pad over the first passivation layer and electrically connecting to the interconnect layer. The method further includes forming a seed layer over the conductive pad; forming a sacrificial test pad over the seed layer; performing a test to the IC die, wherein the performing of the test includes bringing a flat probe tip into contact with the sacrificial test pad; and after the performing of the test, removing the sacrificial test pad.

In an embodiment, the method further includes, before the forming of the seed layer, forming a patterned mask over the conductive pad, wherein the patterned mask provides an opening directly above the conductive pad, and wherein the seed layer and the sacrificial test pad are formed within the opening. To further this embodiment, the method further includes, after the forming of the sacrificial test pad and before the performing of the test, removing the patterned mask.

In an embodiment of the method, the conductive pad includes aluminum, the seed layer includes titanium copper, and the sacrificial test pad includes tin. In another embodiment, the conductive pad includes one of aluminum copper, copper, and titanium, and the sacrificial test pad includes tin (Sn), lead tin alloy ($Pb_xSn_{1-x}$), or a compound having tin (Sn), silver (Ag), and copper (Cu).

In an embodiment, the method further includes, forming a second passivation layer over the first passivation layer, the conductive pad, and the seed layer. In a further embodiment, the method includes forming a conductive feature through the second passivation layer and landing on the seed layer. In another further embodiment, the method includes forming a conductive feature through the second passivation layer and landing on an area of the conductive pad where the seed layer is not disposed on. In another further embodiment, the method includes forming a conductive feature through the first and the second passivation layers and landing on the interconnect layer. In yet another further embodiment, the method includes forming metallic bond pads over the second passivation layer.

In yet another example aspect, the present disclosure is directed to a method. The method includes providing an integrated circuit (IC) die, wherein the IC die includes an interconnect layer, a first passivation layer over the interconnect layer, and a conductive pad over the first passivation layer and electrically connecting to the interconnect layer. The method further includes forming a patterned mask over the conductive pad, wherein the patterned mask provides an opening above the conductive pad; forming a seed layer over the conductive pad in the opening; forming a sacrificial test pad over the seed layer in the opening; removing the patterned mask; performing a test to the IC die, wherein the performing of the test includes contacting the sacrificial test pad with a probe tip; after the performing of the test, removing the sacrificial test pad; and forming a second passivation layer over the first passivation layer, the conductive pad, and the seed layer.

In an embodiment of the method, the conductive pad includes one of aluminum, aluminum copper, copper, and titanium, and the seed layer includes one of titanium copper, titanium nitride, and nickel. In an embodiment, after forming the second passivation layer, the method further includes bonding the IC die to another IC die.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a semiconductor die that includes a device layer, an interconnect layer over the device layer, a conductive pad over the interconnect layer, a conductive seed layer directly on the conductive pad, and a passivation layer encapsulating the conductive pad and the conductive seed layer, wherein the conductive pad is between the interconnect layer and the conductive seed layer, wherein a conductive feature lands on the conductive pad and is free from a physical interface with the conductive seed layer, wherein the conductive seed layer is smaller than the conductive pad from a top view.

2. The semiconductor device of claim 1, wherein the conductive pad includes aluminum and the conductive seed layer includes titanium copper.

3. The semiconductor device of claim 1, wherein the conductive pad includes one of aluminum, aluminum copper, copper, and titanium, and the conductive seed layer includes one of titanium copper, titanium nitride, and nickel.

4. The semiconductor device of claim 1, wherein the passivation layer is a first passivation layer, further comprising a second passivation layer over the interconnect layer, wherein the conductive pad penetrating through the second passivation layer and electrically connecting to the interconnect layer, wherein the first passivation layer is disposed over the second passivation layer, the conductive pad, and the conductive seed layer.

5. The semiconductor device of claim 1, wherein the conductive feature goes through the passivation layer, a portion of the passivation layer covering a first region of a surface of the conductive pad, the first region of the surface being between a second region of the surface of the conductive pad where the conductive feature lands and a third region of the surface of the conductive pad where the conductive seed layer is disposed directly on the surface.

6. The semiconductor device of claim 1, wherein the conductive feature goes through the passivation layer and lands directly interfacing an uppermost surface of the conductive pad.

7. The semiconductor device of claim 1, wherein a top surface of the conductive seed layer is substantially flat.

8. The semiconductor device of claim 1, further comprising another semiconductor die that is bonded to the semiconductor die.

9. The semiconductor device of claim 1, wherein the conductive seed layer has two terminal ends covered by the passivation layer.

10. The semiconductor device of claim 1, wherein the conductive seed layer has a first terminal end over the conductive pad.

11. The semiconductor device of claim 10, wherein the conductive seed layer is has a second terminal end over the conductive pad.

12. A semiconductor device comprising:
a device layer;
an interconnect layer over the device layer;
a first passivation layer over the interconnect layer;
a conductive pad extending through the first passivation layer and contacting the interconnect layer;
a conductive seed layer directly on the conductive pad;
a second passivation layer over the first passivation layer and encapsulating the conductive pad and the conductive seed layer; and
a connection terminal extending through the second passivation layer, wherein the connection terminal lands directly on the conductive pad and is away from the conductive seed layer.

13. The semiconductor device of claim 12, wherein the connection terminal lands directly on the conductive seed layer.

14. The semiconductor device of claim 12, wherein the second passivation layer interfaces a top surface of the conductive pad between a point the connection terminal lands on the conductive pad and an end of the conductive seed layer.

15. The semiconductor device of claim 12, wherein the conductive seed layer has a terminal end over the conductive pad.

16. The semiconductor device of claim 12, where the conductive pad is larger than the conductive seed layer from a top view.

17. The semiconductor device of claim 12, wherein the connection terminal includes a solder ball.

18. A semiconductor device comprising:
a first semiconductor die having a front side and a back side; and
a second semiconductor die having a front side and a back side, wherein the back side of the first semiconductor die is bonded to the back side of the second semiconductor die, wherein the first semiconductor die includes:
a device layer, an interconnect layer over the device layer, a conductive pad over the interconnect layer, a conductive seed layer directly on the conductive pad, a passivation layer encapsulating the conductive pad and the conductive seed layer, a bond pad on the passivation layer, wherein the bond pad is on the back side of the first semiconductor die, and
a bond pad via extending through the passivation layer and connecting to the bond pad, wherein the bond pad via lands directly on the conductive pad and is away from the conductive seed layer.

19. The semiconductor device of claim 18, wherein the bond pad via lands directly on the conductive seed layer.

20. The semiconductor device of claim 18, wherein the conductive seed layer has a terminal edge over the conductive pad.

* * * * *